(12) United States Patent
Henley

(10) Patent No.: US 11,380,816 B2
(45) Date of Patent: *Jul. 5, 2022

(54) LIGHT EMITTING DIODE (LED) MASS-TRANSFER APPARATUS AND METHOD OF MANUFACTURE

(71) Applicant: Apple Inc., Cupertino, CA (US)

(72) Inventor: Francois J. Henley, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 93 days.

This patent is subject to a terminal disclaimer.

(21) Appl. No.: 16/712,674

(22) Filed: Dec. 12, 2019

(65) Prior Publication Data

US 2020/0194616 A1 Jun. 18, 2020

Related U.S. Application Data

(60) Provisional application No. 62/779,393, filed on Dec. 13, 2018.

(51) Int. Cl.
| | |
|---|---|
| H01L 33/00 | (2010.01) |
| H01L 21/66 | (2006.01) |
| H01L 21/683 | (2006.01) |
| H01L 25/075 | (2006.01) |

(52) U.S. Cl.
CPC ...... *H01L 33/0095* (2013.01); *H01L 21/6835* (2013.01); *H01L 22/14* (2013.01); *H01L 25/0753* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,634,267 | A | * | 6/1997 | Farnworth ........... G01R 1/0466 29/840 |
| 9,412,663 | B1 | | 8/2016 | Andry et al. |
| 2006/0225273 | A1 | * | 10/2006 | Arneson ................. H01L 24/81 29/834 |
| 2009/0217517 | A1 | * | 9/2009 | Pique ..................... H05K 3/321 29/832 |
| 2015/0111329 | A1 | * | 4/2015 | Wu ...................... H01L 33/0095 438/28 |
| 2016/0172244 | A1 | * | 6/2016 | Tanaka .................... H01L 21/78 438/125 |
| 2016/0284582 | A1 | * | 9/2016 | Dang ...................... C08L 71/00 |
| 2016/0372628 | A1 | * | 12/2016 | Henley ................ H01L 21/7813 |
| 2018/0053751 | A1 | * | 2/2018 | Zou ........................ H01L 21/673 |

OTHER PUBLICATIONS

Search Report and Written Opinion for International Application No. PCT/US2019/066054 dated Apr. 7, 2020.

* cited by examiner

*Primary Examiner* — Ratisha Mehta
(74) *Attorney, Agent, or Firm* — Aikin & Gallant, LLP

(57) ABSTRACT

Embodiments relate to mass-transfer methods useful for fabricating products containing Light Emitting Diode (LED) structures. LED arrays are transferred from a source substrate to a target substrate by an in-process functional test Known-Good Die (KGD) driven mass-transfer of a plurality of LED devices in a high-speed flexible manner. Certain preferred embodiments using beam-addressed release (BAR) mass-transfer approaches are able to utilize a Known Good Die (KGD) data file of the source substrate in a manner that avoids additional steps, rework and yield losses.

12 Claims, 23 Drawing Sheets

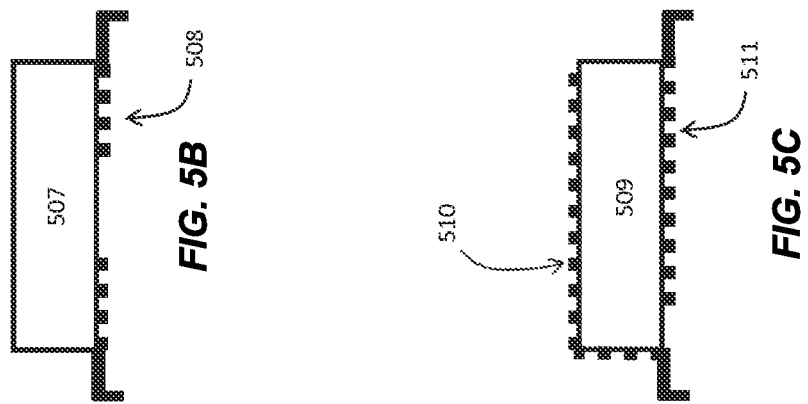
FIG. 5B
FIG. 5C
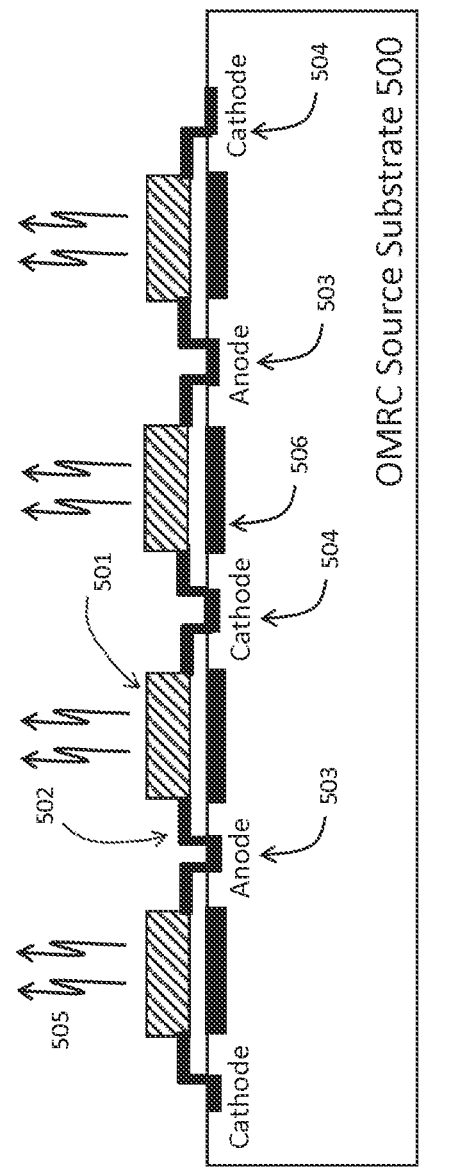
FIG. 5A

| # | Mass-Transfer Technology | MicroLED Selectability | Donor Carrier Type | Required Pre-Process | Required Post-Process | Throughput | Mass-Transfer Process Flow | MicroLED KGD-Driven Production Compatibility |
|---|---|---|---|---|---|---|---|---|
| 1 | Single Pick & Place (Active) | Yes | MRC | None | None | Very Low (<0.1M/Hr) | 1 | Compatible Software Selectable Display Array Setup |
| 2 | Array Pick & Place Stamp (Passive) | No (3-step) | OMRC | Remove Bad Devices or KGD Source Carrier | Requires KGD Fill Step or KGD Source Carrier | Low (~1-20M/Hr) | 2 or 3 | Less Adaptable (3-step) |
| 3 | Array Pick & Place Stamp (Active) | Yes (2-pass) | MRC | None | KGD Fill Step (2nd pass) | Low (~1-20M/Hr) | 4 | Less Adaptable (2-step) |
| 4 | Roll-Roll (Passive) | No (3-step) | OMRC | Remove Bad Devices or KGD Source Carrier | Requires KGD Fill Step or KGD Source Carrier | Medium-High (~10-50M/Hr) | 2 or 3 | Less Adaptable (3-step) |
| 5 | Self-Assembly (Passive) | No (2-step) | ORC | Isolate KGD Devices | None | High (>50-100M/Hr) | 5 | Adaptable (KGD Binning) |
| 6 | Self-Assembly (Active) | Yes | CLO/ORC | Mark Bad Devices | None | High (>50-100M/Hr) | 6 | Adaptable (Mark Bad Devices) |
| 7 | Single-Beam Laser-Induced Forward Transfer (LIFT) (Active) | Yes (2-pass) | ORC | None | KGD Fill Step (2nd pass) | High (>100M/Hr) | 4 | Adaptable (2-pass) |
| 8 | Array Laser-Induced Forward Transfer (Passive) | No (3-step) | ORC | Remove Bad Devices or KGD Source Carrier | Requires KGD Fill Step or KGD Source Carrier | Very High (>200-500M/Hr) | 2 or 3 | Less Adaptable (3-pass & Product-Specific Hardware Setup) |
| 9 | Single-Beam Laser-Assisted KGD "on-the-fly" Directed Assembly Architecture | Yes 1-pass possible (Active) | ORC | None | Reduce/Eliminate Device Fill Step | Very High (>200-500M/Hr) | 1 | Compatible Software Selectable Display Array Setup |
| 10 | Array Laser-Assisted KGD "on-the-fly" Directed Assembly Architecture | Yes 1-pass possible (Active) | ORC | None | Reduce/Eliminate Device Fill Step | Very High (>200-500M/Hr) | 1 | Compatible Software Selectable Display Array Setup |

*FIG. 5D*

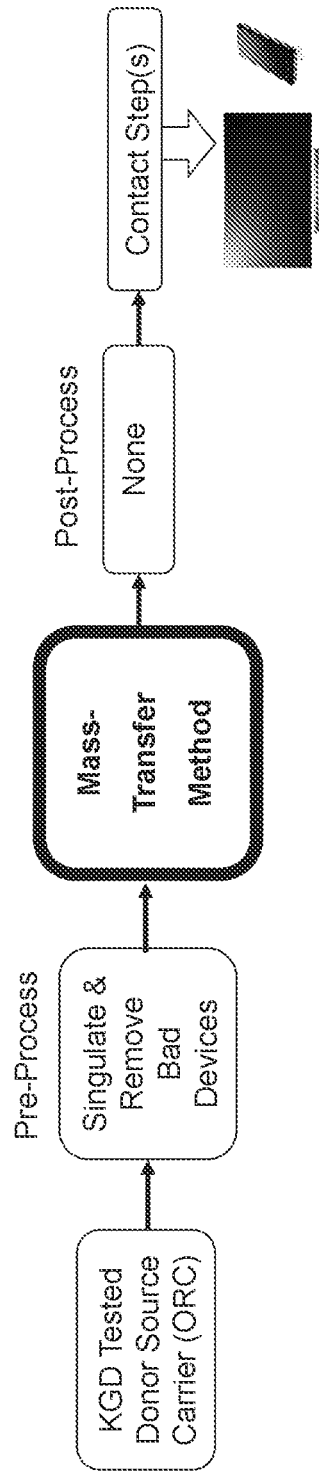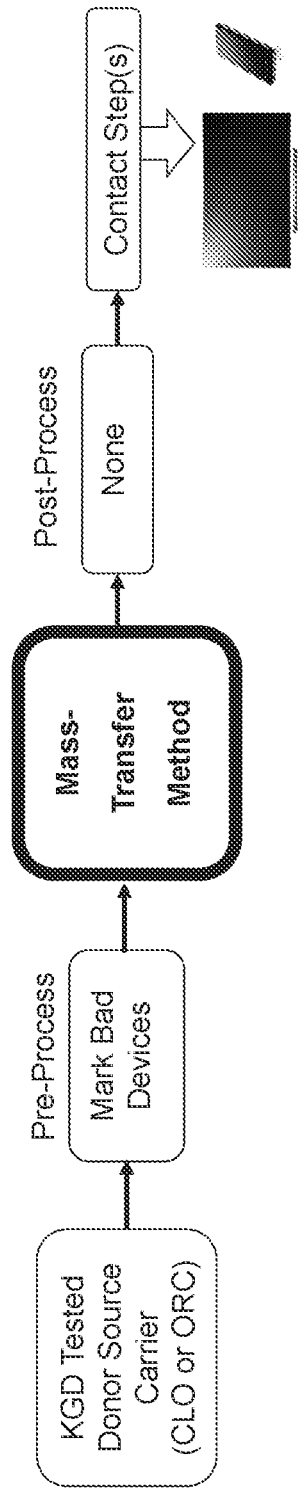
FIG. 10
FIG. 11

LIGHT EMITTING DIODE (LED) MASS-TRANSFER APPARATUS AND METHOD OF MANUFACTURE

FIELD OF INVENTION

This application is a nonprovisional of U.S. Patent Application No. 62/779,393 filed Dec. 13, 2018, the contents of which are incorporated by reference herein.

The present invention relates to light emitting diode (LED) devices. More particularly, embodiments of the invention relate to techniques, including methods and apparatus to efficiently transfer a plurality of Light Emitting Diode (LED) devices from a source surface to a target surface during the manufacturing process. In an example, the method is useful in general LED device transfer and placement and is particularly useful for mass-transfer of micro-LED (uLED) devices that can be as small as a few microns on a side. Micro-LEDs are grown on a support substrate utilizing techniques such as Metallo-Organic Chemical Vapor Deposition (MOCVD) among others. Before the individual devices are used in their final lighting or display application, it is desirable to test the LED devices to establish Known Good Die (KGD) data that can drive a mass-transfer apparatus to place the LED devices with high speed and yield.

BACKGROUND OF INVENTION

Light emitting diodes (LEDs) have been used as a replacement technology for conventional light sources. For example, LEDs are found in signage, traffic signals, automotive tail lights, mobile electronics displays, and televisions. Various benefits of LEDs compared to traditional lighting sources may include increased efficiency, longer lifespan, variable emission spectra, and the ability to be integrated with various form factors.

Although highly successful, improved techniques for manufacturing LEDs is highly desired.

SUMMARY

During the LED manufacturing process, LED structures are formed on a substrate using mass-production processes like those utilized by the semiconductor industry. Process steps such as cleaning, deposition, lithography, etching and metallization are used to form the basic LED structure. To achieve mass-production scale manufacturing and lower cost, numerous devices are simultaneously formed on a substrate using these processes. Different substrates and materials are used depending on the type of LED desired. For example, UV-emitting LEDs are typically made from Gallium Nitride (GaN) material that have usually been either a heteroepitaxial layer on sapphire or free-standing GaN substrates made using Hydride Vapor Phase Epitaxy (HVPE) or ammonothermal methods. For other colors, GaAs or GaP substrates can be used. Recently, GaN, GaAs or other III-V semiconductor materials layer-transferred onto a support substrate has become available as another starting substrate type. These and possibly other LED structures can be mass-transferred using apparatus and methods disclosed in this invention to effect rapid and accurate placement of these LED device structures from a source surface (usually a substrate) with a source areal density to a target surface with an often different target areal density.

Such a density conversion is needed to use a source substrate of LED devices usually arranged in an array to numerous possible target substrate configurations. TVs, laptop screens, computer monitors, cellphone, appliance, automotive and wearable displays are but a few examples that would require programmable areal density mass-transfer apparatus and methods.

Most Micro-LED device "printing" methods are increased throughput versions of the "pick and place" manufacturing method successfully used in many industries including the semiconductor industry. In the semiconductor industry, individual integrated circuit die are often picked from a tray and placed in a final interconnect substrate, interposer or the like. Examples of companies pursuing improved pick and place mass-transfer strategies for Micro-LED manufacturing include Apple Inc. of Cupertino, Calif. and X-Celeprint of Cork Ireland. Both companies are developing variants that pick a plurality of LED devices and then place them onto at least a portion of the target surface. The fitness for use of these methods are characterized by throughput, options for printing only Known Good Die Micro-LED devices and transfer yield. Current approaches suffer from limitations in each of these criteria. For example, X-Celeprint has disclosed some particulars of their micro-transfer-printing capability (SPIE Photonics West 2017 paper 10124-44 and SID 2017 Conference paper 19.4). The throughput is claimed to exceed about 1 million LEDs per hour and that the method has limited to non-existent ability to print KGD devices. Instead, the company suggests an array of post print repair methods. These limitations are believed to be a fundamental result of the physical pick and place approach and difficult to further improve.

The inherent difficulty in utilizing KGD test data to transfer only functionally good dies with a pick and place method can be appreciated by realizing that a physical stamp pick and place method lifts a specific device array from the source substrate and places the array at a specific location within the target substrate. It is essentially "blind" printing of the source array, irrespective of the level of die functionality. The only solution to utilize KGD data would be to lower throughput by adding a non-functional die removal step before target substrate transfer followed by subsequent population of the missing dies later.

The following 4 k UHD TV display example will serve to show how these traditional pick and place methods fall short to be an effective solution for commercially competitive micro-LED manufacturing. This display contains 8.3 million RGB pixels or about 25 million sub-pixels. At 1 million sub-pixel transfer rate per hour, the X-Celeprint system would require about 25 hours to fully populate one 4 k UHD TV. Assuming a 1 TV/minute rate of manufacture for a large-scale TV manufacturing line, an impractical number of micro-transfer-print systems (over 1500) are required. Moreover, post-transfer printing repair will be a major reduction in effective throughput and require substantial rework. Assuming a 10 ppm non-functional micro-LED rate from transfer errors and transferring non-functional dies, each TV will have an average of 250 bad sub-pixels requiring some form of repair. The reliance on post-transfer repair is not only impractical but expensive and fraught with yield and quality issues.

New approaches and methods to generate a KGD data file of the source substrate and flexibly and rapidly transfer only KGD devices meeting a selected set of functional specifications with very low transfer error rate is needed. High placement speed, accuracy and final device functional yield are but a few requirements that are needed for achieving commercially competitive micro-LED manufacturing.

The mass-transfer apparatus and methods described in this invention addresses the requirements of commercially competitive micro-LED manufacturing though the use of process steps and manufacturing sequences that allow the KGD data to become compatible with proposed mass-transfer assembly methods. In a preferred embodiment, an energy beam or beam array such as a laser beam is used to rapidly release a KGD die from the source substrate to the target substrate based on meeting die/location matching criteria. According to certain preferred embodiments of this invention, use of a vertical LED structure that relax the placement accuracy from a specific sub-pixel location to an X-Y area within the sub-pixel called the footprint can substantially improve throughput and matching count. Specific pixels that remain unmatched can be populated by moving the source substrate to a second location. Such moves are repeated until all sub-pixels have been matched & populated. For this invention, pixels and sub-pixels will be used interchangeably to denote a site where a LED device is to be assembled.

The mass-transfer apparatus and process sequences described herein utilizes a KGD data file to avoid transferring LEDs that are non-functional and if necessary, fill missing locations with KGD LED devices according to preset criteria. To be practical in a manufacturing environment, the functional test method needs to rapidly test dense micro-LED source substrate arrays on the EPI growth donor substrate or mounted into a carrier donor substrate. For example, a 6" substrate with an array of 10 μm×10 μm micro-LEDs with and a 5 mm edge exclusion will contain approximately 150 million LED devices. Approaches to non-direct contact functional test of such arrays has been developed by this inventor and has been described by U.S. Pat. Application Nos. 62/435,245, 62.449,554, 62/522,576, entitled "LIGHT EMITTING DIODE (LED) TEST APPARATUS AND METHOD OF MANUFACTURE", which is hereby incorporated by reference herein for all purposes.

The key benefit afforded by this mass-transfer method is its ability to populate KGD LED devices at a high rate that in some embodiments can exceed 100-250 million LEDs per hour. This would make the method able to make target products in a virtually error-free manner and at a rate that is compatible with high-volume manufacturing lines.

The apparatus and method as described in this invention is generally described as KGD-compatible or KGD-driven mass-transfer equipment and methods. One embodiment of using an in-process test KGD-driven method in combination with a selectable single-beam scanned laser approach (Beam-Addressed Release or BAR) is described by U.S. Pat. Application No. 62/525,105 entitled "LIGHT EMITTING DIODE (LED) MASS-TRANSFER APPARATUS AND METHOD OF MANUFACTURE", which is hereby incorporated by reference herein for all purposes.

BRIEF DESCRIPTION OF THE DRAWINGS

FIG. 5A shows cross-sectional views of an OMRC LED source substrate with singulated LED devices isolated by streets and held via edge anchors that can support EL test on the LED device array according to an embodiment of this invention.

FIG. 5B shows a cross-sectional view of a lateral LED device on a OMRC LED source substrate with electrically conductive anchors and surface contact films that would allow in-process test of the LED device array on the OMRC substrate according to an embodiment of this invention.

FIG. 5C shows a cross-sectional view of a vertical LED device on a OMRC LED source substrate with electrically conductive anchors and surface contact films that would allow in-process test of the LED device array on the OMRC substrate according to an embodiment of this invention.

FIG. 5D shows a comparison of certain mass-transfer approaches and their respective compatibility to utilizing KGD in-process test data. Approaches 9 & 10 are optimized and in-process KGD compatible for high-throughput assembly according to embodiments of this invention.

FIGS. 6-11 are the mass-transfer process flows required to optimize use of KGD in-process test data for the mass-transfer methods of FIG. 5D.

DETAILED DESCRIPTION

Figure 1:
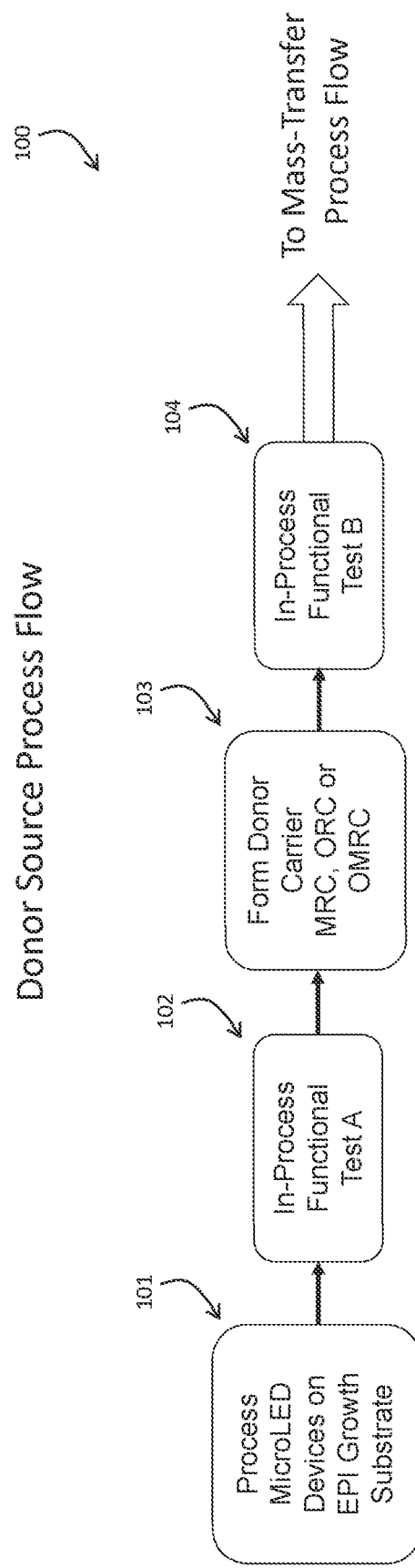
FIG. 1 show donor source substrate process flow to form an optical release carrier (ORC), mechanical release carrier (MRC) or a hybrid optical-mechanical release carrier source substrate according to embodiments of this invention.

A further explanation of LEDs is found throughout the present specification and more particularly below. In an example, one type of LED is an organic light emitting diode (OLED) in which the emissive layer of the diode is formed of an organic compound. One advantage of OLEDs is the ability to print the organic emissive layer on flexible substrates. OLEDs have been integrated into thin, flexible displays and are often used to make the displays for portable electronic devices such as cell phones and digital cameras.

Another type of LED is a semiconductor-based LED in which the emissive layer of the diode includes one or more semiconductor-based quantum well layers sandwiched between thicker semiconductor-based cladding layers. Some advantages of semiconductor-based LEDs compared to OLEDs can include increased efficiency and longer lifespan. High luminous efficacy, expressed in lumens per watt (lm/W), is one of the main advantages of semiconductor-based LED lighting, allowing lower energy or power usage compared to other light sources. Luminance (brightness) is the amount of light emitted per unit area of the light source in a given direction and is measured in candela per square meter ($cd/m^2$) and is also commonly referred to as a Nit (nt). Luminance increases with increasing operating current, yet the luminous efficacy is dependent on the current density ($A/cm^2$), increasing initially as current density increases, reaching a maximum and then decreasing due to a phenomenon known as "efficiency droop." Many factors contribute to the luminous efficacy of an LED device, including the ability to internally generate photons, known as internal quantum efficiency (IQE). Internal quantum efficiency is a function of the quality and structure of the LED device. External quantum efficiency (EQE) is defined as the number of photons emitted divided by the number of electrons injected. EQE is a function of IQE and the light extraction efficiency of the LED device. At low operating current density (also called injection current density, or forward current density) the IQE and EQE of an LED device initially increases as operating current density is increased, then begins to tail off as the operating current density is increased in the phenomenon known as the efficiency droop. At low current density, the efficiency is low due to the strong effect of defects or other processes by which electrons and holes recombine without the generation of light, called non-radiative recombination. As those defects become saturated radiative recombination dominates and efficiency increases. An "efficiency droop" or gradual decrease in efficiency begins as the injection-current density surpasses a low value, typically between 1.0 and 10 $A/cm^2$.

Semiconductor-based LEDs are commonly found in a variety of applications, including low-power LEDs used as indicators and signage, medium-power LEDs such as for light panels and automotive tail lights, and high-power LEDs such as for solid-state lighting and liquid crystal display (LCD) backlighting. In one application, high-powered semiconductor-based LED lighting devices may commonly operate at 400-1,500 mA, and may exhibit a luminance of greater than 1,000,000 $cd/m^2$. High-powered semiconductor-based LED lighting devices typically operate at current densities well to the right of peak efficiency on the efficiency curve characteristic of the LED device. Low-powered semiconductor-based LED indicator and signage applications often exhibit a luminance of approximately 100 $cd/m^2$ at operating currents of approximately 20-100 mA. Low-powered semiconductor-based LED lighting devices typically operate at current densities at or to the right of the peak efficiency on the efficiency curve characteristic of the LED device. To provide increased light emission, LED die sizes have been increased, with a 1 $mm^2$ die becoming a fairly common size. Larger LED die sizes can result in reduced current density, which in turn may allow for use of higher currents from hundreds of mA to more than an ampere, thereby lessening the effect of the efficiency droop associated with the LED die at these higher currents.

LEDs have been used in portable devices such as watches, smartphones and laptops as well as computer monitors and TV displays for many years however only indirectly as an alternative white light source for Liquid-Crystal Display (LCD) display technologies. These were called "LED" TVs and the like, but the actual LEDs were predominantly GaN-based white LEDs to illuminate the backlight in lieu of the cold fluorescent lamp (CFL) backlight sources used before. The color pixel generation continued to be based on LCD technology that worked by a light subtraction process where colors are generated by blocking other colors using an intervening color filter. For example, a red pixel would be generated by a red color filter that blocked the green and blue portion of the backlight LED white spectrum. Grey scale (light intensity of the pixel) occurred by modulating light polarization through a liquid-crystal cell placed between two crossed polarizers along the light path.

Although the LED backlight driven LCD display technology was more efficient and reliable than the CFL backlit version, the technology is still not power efficient. The reason is simple: although the LED white backlight devices can be fairly efficient in terms of external quantum efficiency (photons emitted per electrical carriers injected into the LED device), there are numerous inefficiencies in the rest of this LCD display technology. The first polarizer will cut a little half of the non-polarized white backlight, then each pixel is colorized by subtracting ⅔ of the remaining light (R without GB for red, G without RB for green and B without RG for blue). Other losses include pixel fill factor and film/LCD cell absorption and scattering. The total light output is therefore less than about ⅙ of the white LED backlight intensity.

The trend is for more power efficient and bright display technologies, especially with portable, battery operated devices where battery life is a key factor. Micro-LED is a promising technology for achieving higher power efficiencies. In a micro-LED display, a small LED device placed within a pixel area is directly driven to generate light in a direct emissive manner. Color can be generated either by (i) utilizing blue to UV-LEDs (i.e. GaN-based) with color phosphors or quantum-dot color conversion layers to generate the pixel colors by photon down conversion and/or (ii) by using LEDs that generate the color directly (i.e. AlGaAs, GaAsP, AlGaInP, GaP for red, GaP, AlGaInP, AlGaP for green and ZnSe, InGaN, SiC for blue). In either case, the direct emission/direct view of the micro-LED display promises a six-fold improvement or more in power efficiency.

Although the basic technology to realize micro-LED based displays is well known, numerous manufacturing and quality control challenges exist. One of these is functionally testing millions of micro-LED devices within the manufacturing process in a cost-effective and efficient manner before the pixels are committed to use. Another is the flexible, fast and error-free mass-transfer of micro-LED devices from the source or support substrate to a target surface, plate or area. It is therefore desired to enable KDG data file driven mass-transfer of micro-LED devices and in a manner compatible with micro-LED large-scale manufacturing processes. Further details of the present invention can be found throughout the present specification and more particularly below.

Embodiments of the present invention describe LED device fabrication processes and manners of mass-transfer of LED devices with pre and post process steps to optimize compatibility of KGD-driven assembly with different mass-transfer technologies. In particular, some embodiments of the present invention may relate to manners of mass-transfer of high-brightness LED, medium power LED, low-power LED, miniLED, and micro LED devices.

In various embodiments, description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment" means that a feature, structure, configuration, or characteristic described in connection with the embodiment is included in at least one embodiment of the invention. Thus, the appearances of the phrase "in one embodiment" in various places throughout this specification are not necessarily referring to the same embodiment of the invention. Furthermore, the features, structures, configurations, or characteristics may be combined in any suitable manner in one or more embodiments.

The terms "spanning", "over", "to", "between" and "on" as used herein may refer to a relative position of one layer with respect to other layers. One layer "spanning," "over" or "on" another layer or bonded "to" or in "contact" with another layer may be directly in contact with the other layer or may have one or more intervening layers. One layer "between" layers may be directly in contact with the layers or may have one or more intervening layers.

Certain embodiments of the invention describe an LED device assembly in which an LED device structure layer is transferred from a growth substrate and bonded to a support substrate or plate assembly before further processing. In accordance with embodiments of the present invention, mass-transfer steps can be applied either before the transfer or after one or more transfers. For the purposes of simplifying the various possible configurations wherein the plurality of the LED structures is transferred and possibly bonded onto a different substrate, the resulting substrate (either the growth, support substrate or an assembly) shall be called a source substrate when utilized as a source of devices within the mass-transfer process. If needed, a more descriptive name of source carrier substrate will also be used to describe a carrier substrate that has been processed from the EPI growth substrate in a manner compatible with the particular mass-transfer method selected. For example, the substrate that supported the LED structures during MOCVD growth is also called a source substrate if used within a mass-transfer apparatus directly, however after release and attachment to a support plate, such a plate and any other substrate or plate used to mechanically support the LED device layer will also be called a source substrate. Additionally, the support substrate can be a flexible sheet such as a plastic film to be mounted as a source substrate within the mass-transfer apparatus. The term source substrate will be generally used to connotate its role as mechanical support and will be the substrate described as part of the mass-transfer apparatus throughout this description.

Depending on the specific embodiment of this invention, the support substrate can be transparent and have additional coatings. These either directly support the selected mass-transfer process or exist as part of the requirements of the specific LED manufacturing process step as will be described in more detail below.

Figure 2B:
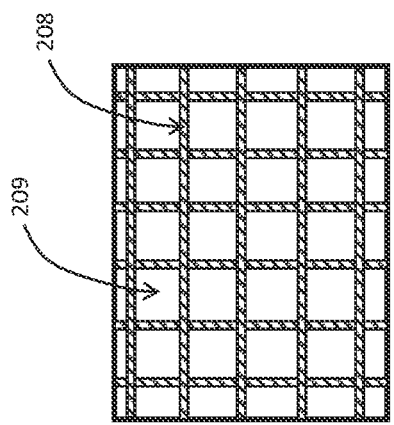
FIGS. 2A-B show a cross-sectional view (A) and a top view (B) of a LED source substrate with singulated LED devices isolated by streets.

Referring to FIGS. 1 and 2, a representative source substrate process flow is represented by the initial microLED processing and formation step 101. In this LED manufacturing step, the LED devices are made in mass-production using methods similar to substrate-based mass-production processes common in the semiconductor industry. The LED structure is deposited onto a suitable growth or support substrate 201 to form an LED array on the surface of the substrate. Depending on the type, quality and color of the LED desired, different substrate material types can be used. Examples are GaP, GaAs, GaN substrates or heteroepitaxial growth substrates such as sapphire, silicon and silicon carbide (SiC) are also possible. comprises of deposited layers that form a n-type cathode layer 202, an active layer 203 (usually a Multi-Quantum Well or MQW series of sub-layers) and a p-type layer 204 and p-contact 205.

Figure 2A:
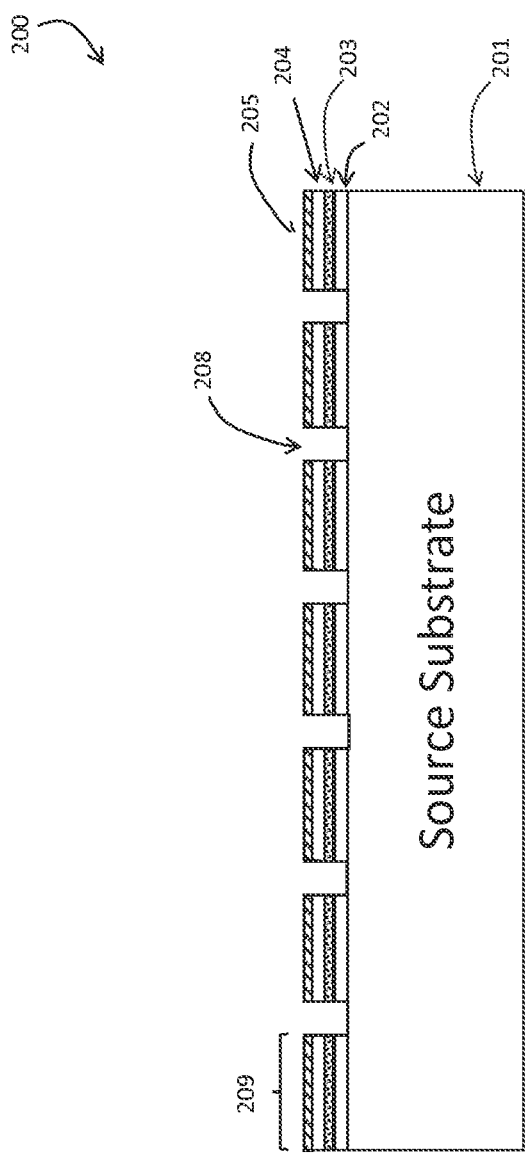

The LED substrate 200 of FIG. 2A contains multiple, singulated LED structures. Isolation of individual LED devices of the desired size and function can be made within the LED manufacturing sequence using process steps such as etching, lithography, passivation and deposition. The desired LED devices can be isolated while residing on support substrate 201 using processes such as etching to form for example a trench 208. If these etch structures (sometimes called "streets") are made over the substrate to form individually isolated structures such as square devices, a high number of LED devices 209 are electrically isolated and available for release and packaging. In this example, the trench 208 is etched through the surface of substrate 201. In this example, a top emitting LED structure is shown where the top contact 205 could be a transparent electrode such as Indium Tin Oxide (ITO). Other structures are possible such as a bottom emitting structure. In this case, the support structure would be preferably transparent and the p-contact layer would be a light reflecting layer such as a metal layer. Of course, there can be other variations, modifications, and alternatives.

The LED device array structure of FIG. 2 can be released as a full layer onto a secondary substrate (often called a carrier) via a laser lift-off (LLO) process or chemical lift-off (CLO) process that disunites the LED device layer preferably about interface between the source substrate 201 and the LED bottom layer 202. The secondary substrate is now called the source substrate if used as the support to transfer individual LED devices. Sapphire growth substrate used to form LED devices by MOCVD processes have been released using global laser lift-off processes in preparation for bonding onto the source carrier substrate. LLO system built specifically to release epitaxially grown GaN layers are available from companies such as Coherent Inc. (Santa Clara, Calif.). Due to the large bandgap of GaN, UV lasers must be used. Use of a 247 nm excimer-based KrF for GaN-Sapphire LLO is described in "Line Beam Laser Lift Off Approach for sapphire removal", R. Delmdahl & al., ICALEO 2012, 852 (2012). The application of The high fluence required (over 650 mJ/cm$^2$) and the potential to damage the LED devices when longer wavelengths are used makes this. For example, significant reverse bias leakage increase was observed when using a 355 nm triple-YAG laser-based release process as described in J. H. Cheng & al., "Effects of Laser Sources on Damage Mechanisms and Reverse Bias Leakages of Laser Lift-Off GaN-Based LEDs", Journal of the Electrochemical Society, emission line, 156 (8) H640-H643 (2009). As will be shown below, there are practical and process advantages in using the GaN LLO release to form a carrier source substrate rather than attempting to use this method to directly release individual LED devices. Of course, there can be other variations, modifications, and alternatives.

Depending on the choice of mass-transfer technology used, the transfer to the donor carrier substrate (step 103 of FIG. 1) is preferably formed using processes to allow subsequent release using mechanical means and/or optical means. For a mechanical-release carrier (MRC) mass-transfer source substrate, the LED devices are processed to have mechanically releasable means that would allow a pick and place method to be able to pick the selected LED devices with a reasonably low force. Approaches include forming thin silicon dioxide bridges that hold the individual LED devices with an appropriately low stiction. The bridges break and the device will be held by the mass-transfer effector to be placed on the target substrate.

Figure 3:
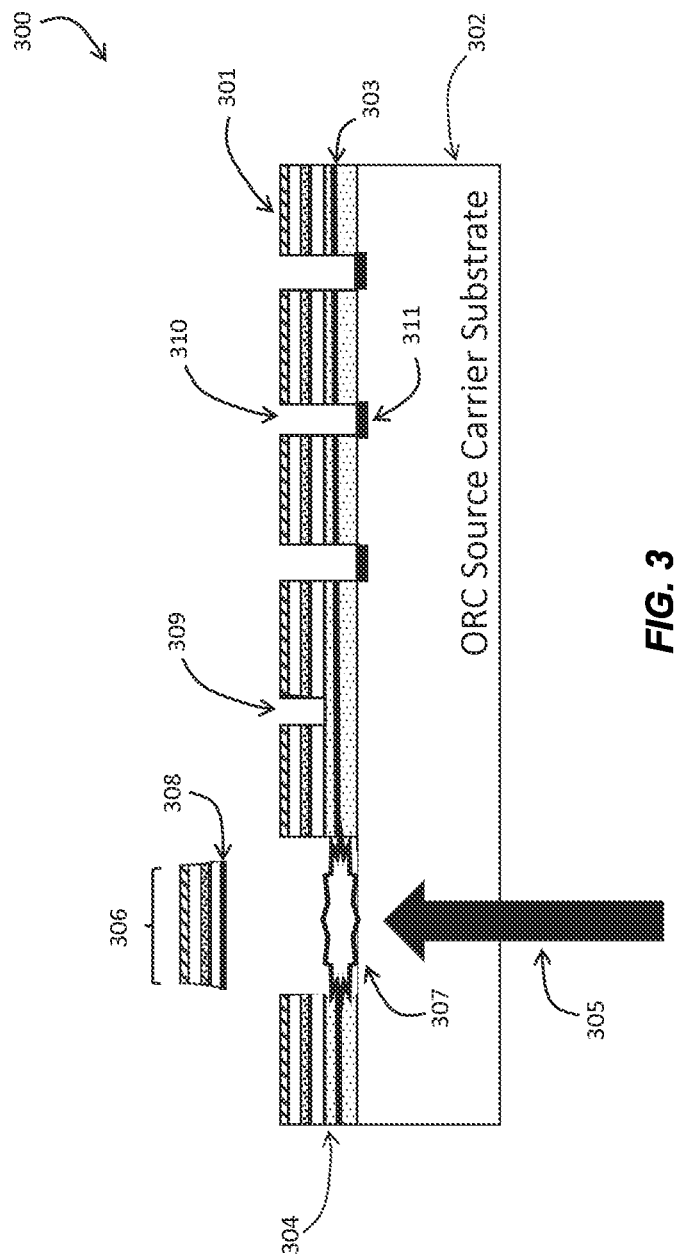
FIG. 3 shows a cross-sectional view an LED ORC source substrate with singulated LED devices isolated by streets and further showing a beam induced release of an LED device according to an embodiment of this invention.

If the release is to be made by optical means, the carrier is described as an optical-release carrier (ORC) such as shown in FIG. 3. In this figure, ORC LED source assembly 300 consists of a plurality of fully singulated LED devices such as LED device 301 transferred from an EPI growth substrate and bonded to a transparent source substrate 302 with one or more intermediate interface layers. The source substrate can be a double-sided polished (DSP) sapphire substrate or a quartz or glass substrate. An energy beam such as a laser 305 is shown as releasing LED device 306 by beam-induced release effect 307. The release process is preferably through an ablation process because of its potential for small area selectivity, fast release response time and lower thermal effects when using nanosecond to picosecond laser pulse duration.

Improvement in the release process of the ORC source substrate 300 can be realized by integrating a release layer more sensitive to the beam characteristics such as depicted in FIG. 3. Source assembly 300 have a plurality of LED devices such as LED device 301 residing on source substrate 302. In this embodiment, the LED devices are coupled to the support substrate using a release layer 303 present within a bond layer 304. An energy beam such as a laser 305 is shown as releasing LED device 306 by a beam-induced release effect 307. In this example, the release layer 303 is optimized to have the release effect be less violent or require less beam pulse energy. If the source assembly 300 is a bonded substrate prior to the LED formation, no prior chemical or laser lift-off steps are required after LED device formation. The post-MOCVD substrate with an integrated release layer can directly become the source substrate for ORC mass-transfer use.

Trench 309 between LED devices can also be modified such as trenches 310 to enhance thermal isolation between adjacent devices. An intervening metal layer or other reflective layer 308 can be integrated between release layer 303 and the LED devices such as LED device 306 if additional protection for the LED devices from the energy beam 305 is desired. Optional light blocking layers 311 under the streets can also improve thermal and optical isolation between adjacent LED devices.

In certain mass-transfer selections, KGD-driven mass-transfer would advantageously use a carrier source substrate capable of mechanical and optical release. This hybrid source substrate is called an OMRC source substrate. FIG. 4 shows one method in which the LEDs can be made releasable by either mechanical or optical means. The OMRC source substrate 400 is made form a transparent substrate 401 similar to an ORC substrate, however the LED devices 402-404 are mounted using light sensitive anchors 405 that in this example mount the LED devices slightly above the substrate 401. The material of the anchors is chosen to be optically sensitive to the laser source 406 as well as falling within a selected range for breaking mechanically using a force 407 from a pick and place tool. A thin InN film is one possible anchor material. This source substrate design also includes optical protection of the microLED using an intervening metal layer or other reflective layer 408 on or near the top surface of substrate 401. This feature is useful to avoid leaving post-process release layer residue on the LED device lower surface that may require an additional clean step. LED device 402 is optically released where the device anchors are rendered mechanically weak to select the release of LED device 402. The laser is blocked from reaching the LED device 402 however the anchors holding the device on the sides interact with the beam to release the device. LED device 403 is not selected and stays on the source substrate. LED device 404 is released via mechanical force 407. The level of optical and mechanical energy required for the process can be adjusted for the mass-transfer method used. For example, an ORC edge anchored source carrier substrate could be made using this approach by adjusting the mechanical release force to be substantially higher.

Figure 4B:
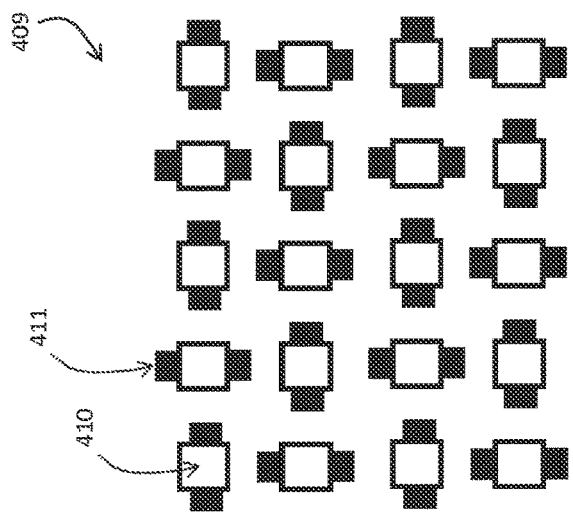
FIG. 4B shows a top view of an array of LED devices held by edge anchor in a pattern according to an embodiment of this invention.
Figure 4A:
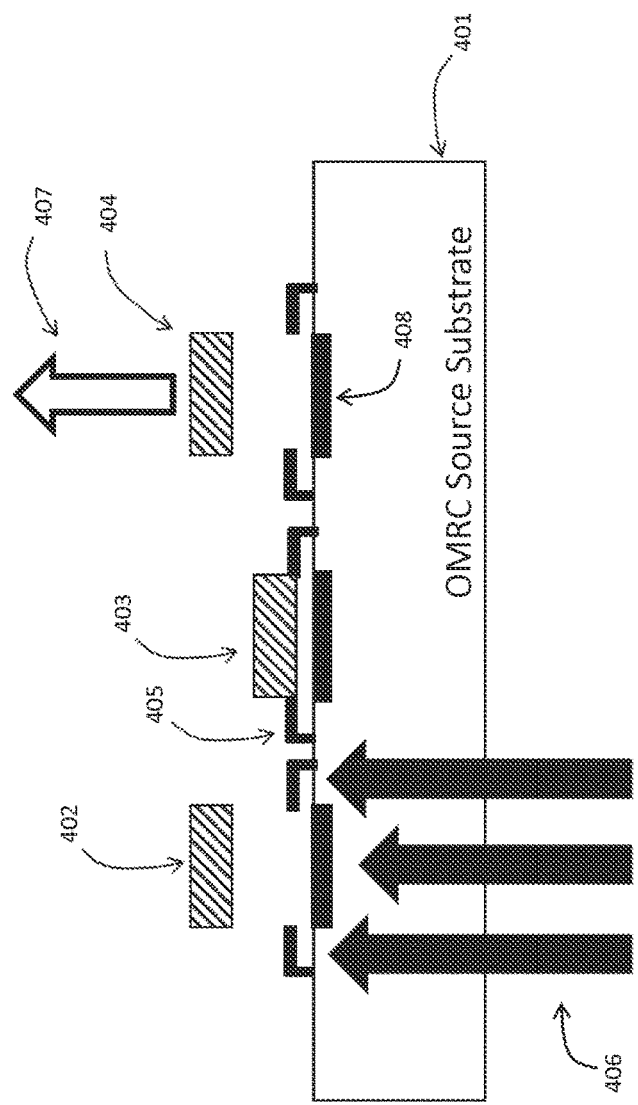
FIG. 4A shows a cross-sectional view of an OMRC or MRC LED source substrate with singulated LED devices isolated by streets and held via edge anchors and further showing a beam induced release of an LED device (in an optical release enabled configuration) and a mechanically-induced release (in a mechanical release enabled configuration) according to embodiments of this invention.

FIG. 4B shows a top view 409 of one embodiment of the OMRC source substrate. Optical damage to anchors 411 from selection of adjacent LED device 410 is reduced by alternating the placement of the anchors.

Examples of a release layer suitable for the 355 nm to 1064 nm YAG laser lines is ITO and other oxides that can readily ablate with femtosecond to picosecond pulses. Processes to ablate ITO is described in "Picosecond Laser Patterning of ITO Thin Films", A. Risch & R. Hellman, Physics Procedia, 12 (2011) 133-140. The study included 355 nm, 532 nm and 1064 nm where 50-100 nm of ITO was ablated using a single pulse of about 10 µJ in energy at a spot size of about 42 µm, corresponding to a process of 0.5 J/cm². Ability to release with one pulse, tight beam focusing allowing the beam to be focused well enough to reliably release a target LED device while not affecting neighboring LED devices and X-Y positional accuracy and repeatability are among the important release beam optics and other characteristics for suitability within a BAR mass-transfer application. Another example of a potentially suitable release layer 303 is to decompose an Indium Nitride (InN) layer using 355 nm and 532 nm YAG-based solid-state lasers. For example, a lower fluence, 532 nm ablation process using a InN layer as a releasable bond within a layer-transfer process based EPI growth substrate synthesis is described in US2016/0372628A1. The patent application describes a 3000 A InN sputtered film ablated with a fluence of 50-75 mJ/cm² using a sub-nanosecond pulsed scanning laser system with a 40-60 um spot size. Of course, there can be other variations, modifications, and alternatives.

The LED device array structure of FIG. 3 can also be formed from the EPI growth substrate to the secondary substrate via a similar laser lift-off (LLO) process that disunites the LED device layer about release layer 303 or using a chemical lift-off (CLO) process that selectively removes interface between the GaN layer and the EPI growth substrate. If a CLO process is used, the lift-off process would occur by using a chemical process to release the plurality of LED devices onto the secondary substrate. For example, GaN on silicon EPI growth substrates with process LED devices could be released by a mechanical grind step of the silicon substrate followed by a chemical bath to etch the remaining silicon and complete the release of the EPI growth substrate. Of course, there can be other variations, modifications, and alternatives.

In embodiments where the source assembly 300 is fabricated from a previously released layer of LED devices 301 from a MOCVD growth substrate and bonded onto a secondary substrate 302, the choice of the ORC mass-transfer release layer 303 can be less restricted since it does not have to be subjected to high-temperature MOCVD and other LED device formation processes. For example, the release layer could be an organic or inorganic release layer with a limited high-temperature stability range. An organic UV or thermal release layer could be utilized, similar in function to release tape products such as the ELEP HOLDER UV release tape and the NWS-Y5V thermal release tape manufactured by the Nitto Denko Corporation, Osaka Japan. To be effective in this application and support high-throughput assembly, thin films with low UV fluence and thermal budget formulations are required. An inorganic release layer would preferably be a thin layer that can efficiently decompose upon laser irradiation to a state of low adhesion. Of course, there can be other variations, modifications, and alternatives.

After the formation of the LED devices on the source substrate, testing of the LED devices for meeting certain predetermined criteria can be made. Source substrate LED devices can undergo an in-process functional test to determine the functionality of the individual LED devices on the source substrate using an electro-optical test such described in U.S. Pat. Application Nos. 62/435,245, 62.449,554, 62/522,576 entitled "LIGHT EMITTING DIODE (LED) TEST APPARATUS AND METHOD OF MANUFACTURE". The test method utilizes a field plate and second electrode to inject a current to a plurality of the LED devices on the source substrate and measure its response using a sensor such as a camera. Alternatively, if direct electrical connections are made available, electrical stimulus can be directly applied. The response can be measured using a sensor such as a camera.

The measurement result of this functional test is a value proportional to the emission of each LED device as a function of an injected current density J (A/cm²). The collection of a plurality of LED device results and be stored as a value according to the LED position in a matrix (i,j) for further analysis. Random-access laser lift-off or other individual LED device release methods could aggregate LED devices having similar bin numbers based on the bin label matrix value for each (i,j) LED device. This could be useful to limit display non-uniformity caused by using LED devices having excessively different functional characteristics. Multiple thresholds could also be utilized to develop statistics useful for yield and process control. For example, the standard deviation and other statistical analyses applied to bin data can be an indicator of yield and process stability. Sudden changes in these derived quantities can signal a process excursion. Of course, there can be other variations, modifications, and alternatives.

Although the KGD file can be as simple as a list of bad die locations, it is understood that there may be more sophisticated criteria such as matching LED devices with close or uniform response for release within a target display. Binning would be adjusted to match devices having characteristics within a predetermined bin range value.

A second in-process functional test can also be performed after the ORC/MRC/OMRC source substrate is processed (step 104 in FIG. 1). The KGD data file used to drive the mass-transfer process is thus derived from either or both in-process functional test steps 102 and 104.

Assuming a good/bad KGD file is produced from the test of the source substrate at steps 102 and 104, the source substrate can now be used by the mass-transfer process.

The OMRC carrier can include electrical layers and patterned contact to allow in-situ electrical test of the LED devices using the above test method or by direct electrical according to another embodiment of this invention. FIG. 5 shows an OMRC source substrate 500 with numerous LED devices 501 held with anchors 502 with limited electrically conductivity. Anode lines 503 and cathode lines 504 allows parallel connection of the LED devices. Pulsing the anode and cathode lines would simultaneously energize the devices by biasing the LED devices via the anchors. Good devices would emit light 505. A light measuring camera could measure these devices and develop the KGD data for use to drive mass-transfer for KGD-only LED device assembly. Light blocking layers 506 can be present as well. To lower the effects of one or more shorted devices in this parallel direct electrical test, the anchors could be designed to isolate the LED devices with a relatively high anchor resistance. FIG. 5B shows an example of a lateral LED device structure 507 where the anchors are connected to layers 508 that can function as a test layer during in-process test but stay with the device after assembly without deleterious effects. FIG. 5C shows a vertical LED device 509 with connection layers 510 and 511. The LED device connection layer(s) may use transparent ITO to allow connection to device areas that is expected to emit light. Of course, there can be other variations, modifications, and alternatives.

The selection of the type of source substrate (ORC, MRC, or OMRC) is highly dependent on the mass-transfer technology to be used.

Mass-Transfer Process Flow Description

The mass-transfer process flow is dependent on numerous factors that can affect its ability to utilize in-process KGD data. FIG. 5D shows how ten mass-transfer technologies and variants can be used with in-process KGD data within a mass-production environment. Methods 1-4 are mechanical, methods 5-6 are self-assembly methods. These methods attempt to arrange the LED device in a pattern by moving singulated LED devices in large numbers to locations that are energetically favored, much like ball bearings would roll on a moving surface to drop in a regular hole pattern. Methods 7-10 are derived from LIFT methods (Laser Induced Forward Transfer), a generic name for local selection of laser-induced direct writing of materials in fluid or solid form. The methods 9 and 10 include LED device/KGD matching onto a pixel footprint of available positions to reduce or eliminate the post-process fill step according to certain embodiments of this invention.

One of the most important criteria for mass-transfer compatibility is the ability to select individual LED devices for transfer in a rapid and random-access manner. When a mass-transfer method is passive (not selective), its ability to use the in-process KGD information is significantly reduced or eliminated. External processes must be added achieve some level of KGD compatibility. The six major mass-transfer process flows are shown in FIGS. 6-11. The process flows predominantly differ on how they can support a specific mass-transfer method to optimize its ability to use KGD information and only print good LED devices to the target substrate. Some of these process flows are significantly more complex and expensive, requiring pre and post mass-transfer process steps that will likely increase cost and complexity of the general manufacturing process.

Mass-Transfer Method 1: Single Arm Pick and Place

Figure 6:
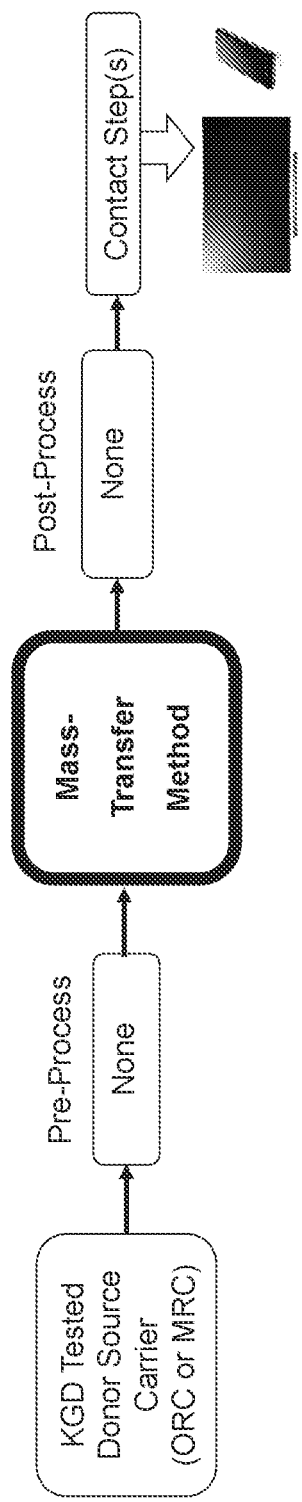
Figure 7:
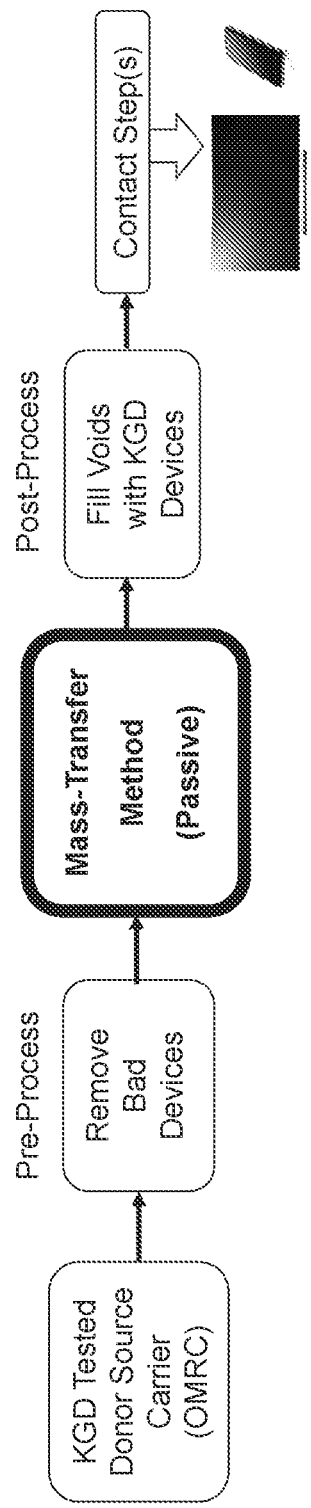
Figure 8:
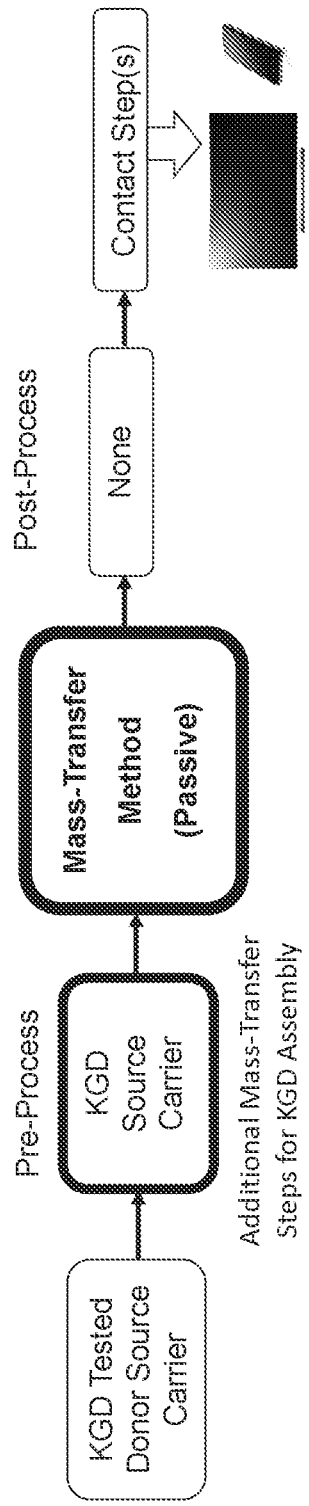

The single arm pick and place is readily available and is currently used for miniLED display manufacturing. A large LED display (ex. the "Wall", a 146-inch 4 k UHD display by Samsung Electronics of Korea) uses method 1 (FIG. 6). The method is fully compatible with KGD in-process data however its low throughput and inability to work on LED devices having sizes approaching 100 um makes the method unable to scale to microLED and consumer display products. Its active placement capability could make it able to perform the fill step required in process flows 2 & 3 to support passive mass-transfer methods 2, 4, and 8. One example of this method is the model GS100BH system offered by Hoson (Shenzhen, China). It has a 16/sec assembly rate with a minimum device size of 125 um.

Mass-Transfer Methods 2 and 4: Array Pick and Place Stamp and Roll-Roll (Passive)

Scaling the pick and place device count from 1 to pick up thousands to tens of thousands of devices in parallel was adopted by LuxVue (now part of Apple, Cupertino, Calif.) and Xceleprint (Cork, Ireland) using a stamp and KIMM (Daejon, Korea) using roll-roll 1:1 printing methods to increase throughput. The passive "blind" printing of these array methods requires substantial pre and post mass-transfer processing to utilize in-process KGD data. Process flow #3 (FIG. 8) is particularly difficult since it requires pre-processing of the source carrier substrate to present a 100% KGD array using other mass-transfer methods before the attempting the mass-transfer step. Process flow #2 (FIG. 7) requires a bad die removal as a pre-process to avoid printing bad die and a post-process fill step to populate the voids with KGD device after the array mass-transfer. Since laser-assisted assembly using active methods would likely be required to perform these pre and post process steps, a novel OMRC compatible source substrate is required as disclosed in this invention.

Mass-Transfer Methods 3: Array Pick and Place Stamp (Active)

Figure 9:
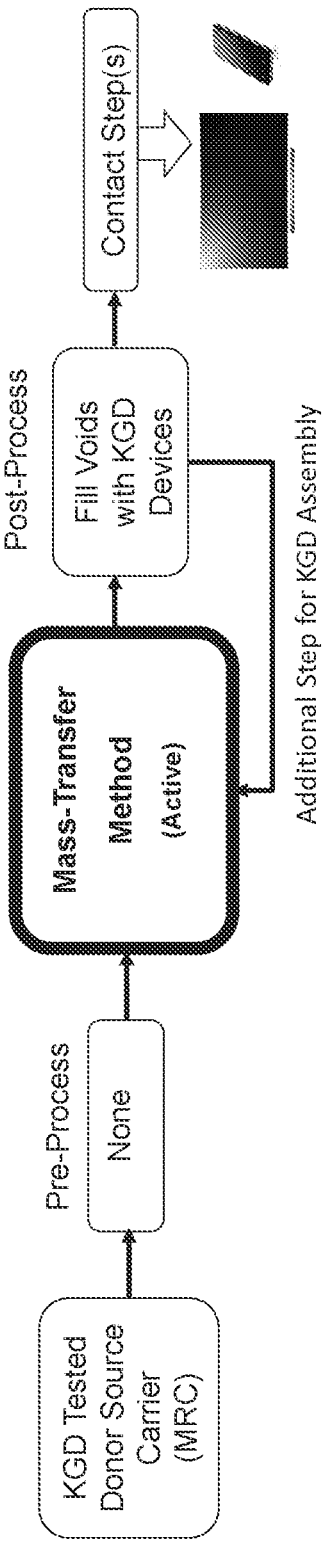

A stamp with individually addressable pick up force can perform the pre-process function and simplify the mass-transfer process flow. The modified process flow is shown in FIG. 9 (process flow #4). The KGD devices on the source substrate is transferred during the first pass without picking up bad LED devices. A second pass selects and mass-transfers replacement devices to fill and complete the target substrate. It is the only mechanical method that can perform a KGD target substrate assembly without requiring external pre and post process steps. A programmable stamp array has been disclosed using a per-device programmable electrostatic chuck (U.S. Pat. No. 8,333,860 assigned to Apple, Inc.). It is unclear if this method will be able to overcome the fundamental throughput limitations inherent in mechanical pick and place.

Mass-Transfer Methods 5: Self-Assembly (Passive)

Self-assembly mass-transfer is way to create a desired pattern of LED devices by moving and transporting a large number of singulated devices over a target substrate and using stochastic processes and localized energy wells to fix the device in their desired location. It is similar to shaking a tray of ball bearing over a surface that contain dimples in a regular pattern. If the shaking does not eject the ball bearings after they find an empty depression, the tray will eventually be populated with a regular pattern of ball bearings. The ball bearings that have not found a location can be gently rolled off the surface. eLux (Vancouver, Wash., USA) drift the LED devices over a patterned substrate using a fluid and depressions and gravity forming the energy minima. SelfArray (Troy, N.Y., USA) uses a thin graphite coating on the LED devices that has sufficient paramagnetic properties to levitate the microLEDs on top of a magnetized target surface. The microLEDs to get trapped at a selected location with a magnetic minima. Since these methods are statistical in nature, these self-assembly methods are passive. The higher compatibility of these methods with in-process functional test data for KGD-driven assembly than the pick and place methods is due to the simple requirement of just making only the good LED devices available to the mass-transfer process. Passive self-assembly mass-transfer process flow is shown in FIG. 10 (process flow #5). Singulating and generating a source of KGD LED devices is relatively simple and efficient. For example, an ORC donor substrate can first be rid of the non-functioning LED devices, after which the rest is singulated in bulk in a vial or cartridge for use in the self-assembly step.

Mass-Transfer Methods 6: Self-Assembly (Active)

An active self-assembly technology reported by Xerox-PARC (Palo Alto, Calif., USA) uses an active addressing method using a dense array of addressable areas to move LED devices in desired directions (E. M. Chow & al., SCALABLE MICRO OBJECT ASSEMBLY AND TRANSFER, WOP-14 open poster session, Solid-State Sensors, Actuators and Microsystems Workshop, Hilton Head, June 2018). The method achieves selectivity using active feedback with a camera and image processing to see the state of the self-assembly, then driving the active plate to move the LED devices to be in the desired pattern. Because there is feedback and image processing, selection of good and bad die is possible during the assembly process if the bad dies are marked after in-process functional test. Active self-assembly mass-transfer process flow is shown in FIG. 11

(process flow #6). The singulation can occur with a chemical or other global lift-off without selection with marked bad die or with prior removal of bad die.

Mass-Transfer Methods 7: Single-Beam LIFT (Active)

This approach assembles a KGD target substrate using the same two pass approach as the active pick and place stamp method (FIG. 9, mass-transfer process flow #4). The potential for high throughput, ability to select individual is attractive, however the second pass requirement for KGD LED device fill will lower throughput.

Mass-Transfer Methods 8: Array (Multi-Beam) LIFT (Passive)

A method for laser-assisted mass-transfer using a laser array has been proposed by Uniqarta (Cambridge, Mass., USA) and Coherent (Santa Clara, USA). This array multi-beam passive method is similar in requiring process flow #2 pre and post steps or a comprehensive KGD pre-process flow #3. Uniqarta describes achieving process flow #2 using a combination of single-beam (method 7) to pre and post process the source substrate. The use of a thermo-mechanical ORC carrier with a process response time estimated at 20-50 usec forces the array to be stationary with substantial throughput penalties. This method may have potential but its reliance on an array passive process and a likely secondary single-beam system in a production environment limits achievable throughput and increases method complexity and cost.

Other attempts to use laser-assisted mass-transfer have not shown high productivity. V-technology (Yokohama, Japan) recently described a direct GaN local LLO microLED release process for microLED mass-transfer using a quadrupled YAG 266 nm. The demonstration system irradiated an area of 25 um×500 um with a laser pulse of 50 uJ with a repetition rate of 720 Hz. This corresponds to a single-shot process fluence of 400 mJ/cm$^2$, close to the reported GaN decomposition fluence threshold of about 650 mJ/cm$^2$. This corresponds to an areal process rate of 0.09 cm$^2$/sec. At 1600 LED device/cm$^2$ (75" diagonal display at 4 k UHD resolution), the mass-transfer rate is about 500 k devices/sec.

It is therefore an object of this invention to develop methods that allow high throughput mass-transfer of LED devices from large miniLED sizes to the smallest (sub-10 um) microLED. It is another object of this invention to achieve high throughput mass-transfer without requiring pre and post mass-transfer process steps. Methods 9 and 10 are single-beam and array beam active mass-transfer methods that include elements of the invention, namely, to allow rapid assembly of KGD LED devices without loss of throughput and with a minimum use of post-processing fill.

Mass-Transfer Methods 9: Single-Beam LIFT with Directed Assembly Method (Active)

For the method 9 description, the following source ORC assembly will be assumed:
  a. Source substrate is a DSP sapphire substrate of 150 mm in diameter and 1 mm in thickness having a release layer (RL) releasable with a 0.25 J/cm$^2$ pulse process with a 355 nm, 532 nm or 1064 nm laser source capable of individual LED device addressing.
  b. LED device array of 15 µm×15 µm (10 µm device width with a vertical device architecture and a 5 µm gap or street between devices). Top is anode and bottom is cathode.
  c. LED device array is a square array of 105 mm×105 mm in size containing 70,000×70,000 LED devices or 49 million individual LEDs.

Figure 12:
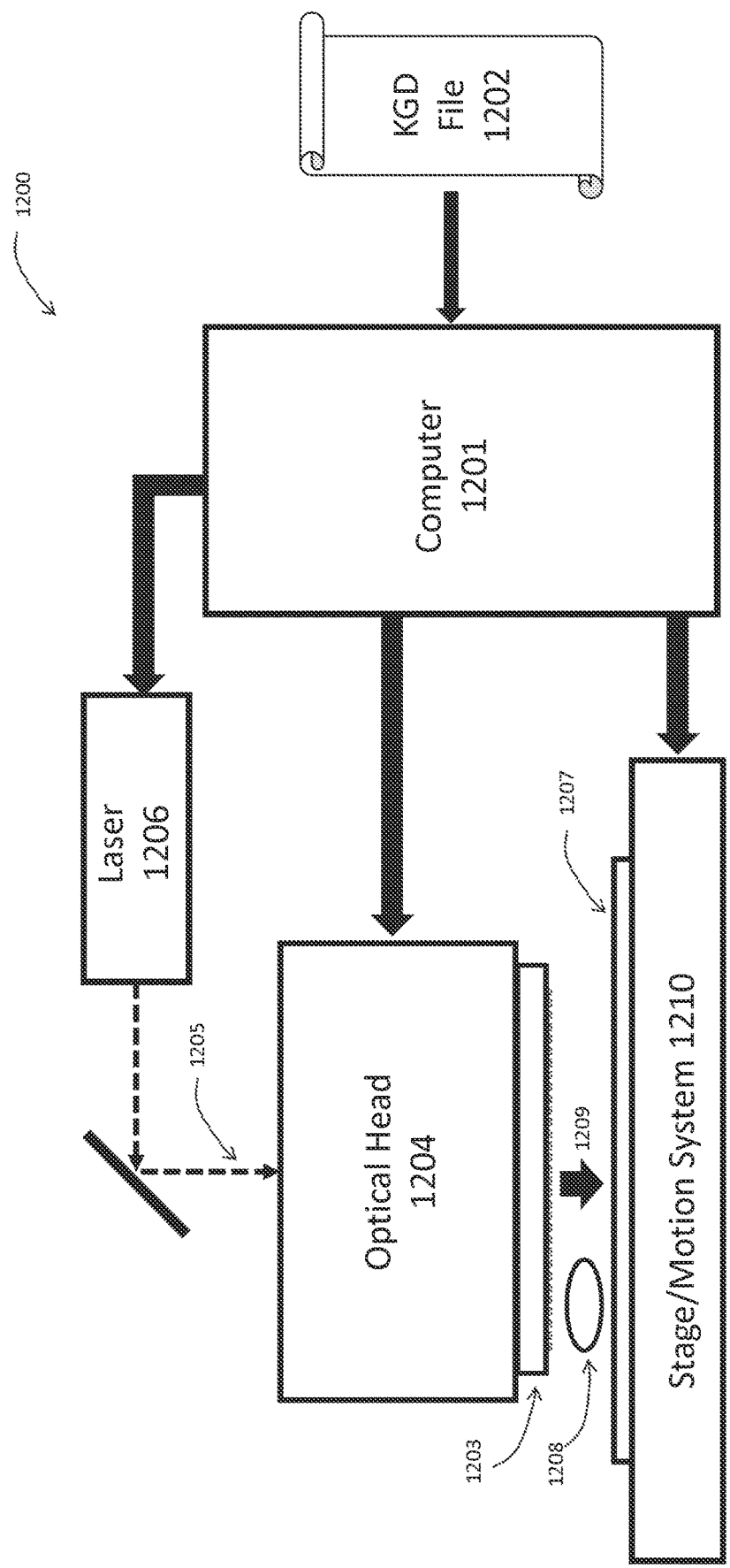
FIG. 12 shows a block diagram of a Beam Addressed Release (BAR) mass-transfer system according to a specific embodiment of this invention.

Assuming a good/bad KGD file is produced from the test of the source substrate, the substrate can now be mounted onto a print head of a Beam-Addressed Release (BAR) mass-transfer tool to populate a target array with a plurality of LED devices. The BAR mass-transfer system block diagram 1200 is shown in FIG. 12. The BAR system is composed of a computer 1201 receiving a KGD file 1202 that will serve to execute an algorithm to release a plurality of LED devices present on the corresponding source substrate 1203. The algorithm utilizes input parameters such as the KGD file data, source and target array pitch and dimensions and selection and matching criteria to populate the target substrate with high speed and yield. The source substrate 1203 is attached to a scan head 1204 that can direct a laser beam 1205 from a laser system 1206. The beam is addressed to individual LED devices according to preselected conditions as further explained below. The beam is adjusted to be able to release specific LED devices from the source substrate 1203 to a target substrate 1207 across a gap medium 1208. The transference of the LED devices is shown as a disuniting action from the source substrate 1203 to a uniting action on a predetermined location on the target substrate 1207 by arrow 1209. In this specific embodiment, relative motion between the source and target substrates is accomplished using a stage/motion system 1210.

Figure 13B:
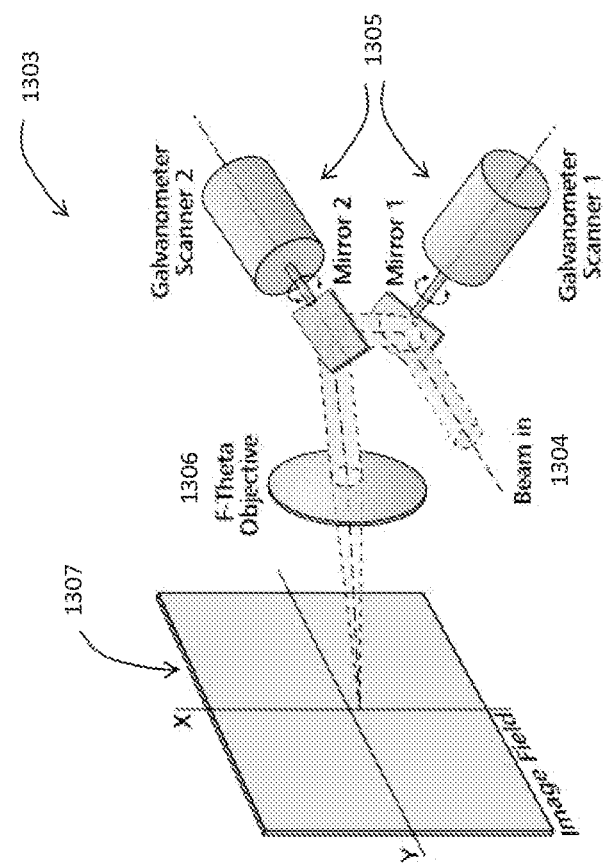
FIG. 13B shows a galvanometer X-Y mirror beam scanning system with f-theta lens for use within a single-beam Beam Addressed Release (BAR) mass-transfer system according to a specific embodiment of this invention.
Figure 13A:
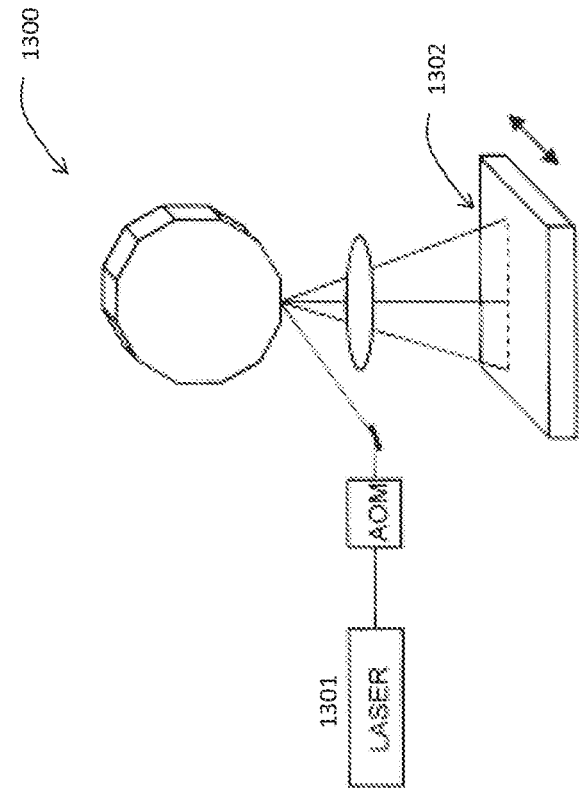
FIG. 13A shows a polygonal beam scanning system for use within a single-beam Beam Addressed Release (BAR) mass-transfer system according to a specific embodiment of this invention.

The BAR mass-transfer system scan head hardware can use commercially available systems that support high-throughput and high-yield operation. The scan head X-Y scan be realized using (i) a rotating polygon mirror scanner in one dimension with a galvanometer mirror or mechanical scan in the second dimension or (ii) a two-dimensional laser scanner such as a galvanometer motor-driven mirror in each of the two scan dimensions. FIG. 13A shows a figure of a rotating polygon mirror scanner 1300 to scan a laser beam 1301 onto a surface 1302. Such systems are available from companies such as Lincoln Laser Company, Phoenix, Ariz. USA. FIG. 13B shows a X-Y scan head 1303 scanning an input laser beam 1304 using a dual axis galvanometer mirror assembly 1305 and optical lens 1306 to scan a target surface 1307. There Such systems are available by companies such as Lincoln Laser Company, Phoenix, Ariz. USA and Scanlab GmbH, Puchheim, Germany. To allow random-access addressing without compromising throughput, a X-Y galvanometer coupled to an optical f-theta lens can be an effective solution for the scan head. For example, a Scanlab IntelliSCAN 10 coupled to a near-telecentric lens such as a 255 mm f-theta lens would allow a 180 mm×180 mm scan area with a spot size of about 20-30 µm and up to 8000 mm/sec scan speed. Such a system is available for Coherent Inc., Santa Clara, Calif. USA as a PowerLine Pico series laser marking system. Other telecentric lens laser scanners such Model MD-T1000 are available by Keyence Corporation, Osaka Japan. The MD-T1000 has 80 mm×80 mm full telecentric scan capability, ~20 µm spot size and up to 12,000 mm/sec scan speed.

Although the X-Y galvanometer-based scanner has more flexibility, a large scan area is often realized by employing a scanning lens with a longer working distance and lower numerical aperture. The result is a larger spot size at the image plane. A rotating mirror scanner could use a linear lens placed closer to the image plane field to help better focus the optical beam in one dimension. If further reduction of the beam size is desired to better localize the beam energy within desired LED device areas, the beam can be truncated using a mechanical mask or an optical apodizer in close proximity to the image plane. The mask would have a desired pattern of openings to match the desired LED device transfer pattern and be spatially adjusted in X, Y and rotation axis with respect to the target substrate. This beam spatial filtering method may also be necessary if the laser system is more slowly modulated or has a longer pulse width that effectively "smears" the beam intensity profile along the scan direction. In this example, a mechanical mask with a slit perpendicular to the scan direction and an opening roughly the size of the LED device would remove optical energy that could spill over to adjacent areas and cause erroneous LED device transfers. Of course, there can be other variations, modifications, and alternatives.

The LED device transfer from the source substrate(s) to the target substrate can be accomplished using different scan and motion methods. One example is a scan pattern in one direction (ex. X-axis) while the scan head and target substrate is moved in another direction (ex. Y-axis). A laser scanner utilizing a polygon rotating mirror could work within such an embodiment. Another example is to move the source substrate to a location called a site and have an X-Y scan head populate the LED devices for the selected site. A micro-jog (small X-Y move within a site) to allow KGD LED devices to become matched to one or more pixels that were not previously matched with KGD LED devices may be necessary. Once the site has been populated with LED devices, a site move is made to a new area. This process is repeated until the target substrate is fully populated. The succeeding examples will generally utilize the X-Y scan head embodiment described above however it is to be recognized that other relative positioning of KGD LED devices to a target substrate can be realized using variations, modifications, and alternatives embodiments of this invention.

The laser system must be able to direct a beam that can be focused and support flexible and accurate release timing synchronized with the scan head beam location. A Q-switch laser may suffice to perform the release function however its relatively high pulse to pulse energy variation, timing jitter, longer pulse width and inter-pulse duration effect on pulse energy are all considerations that make this common marking and cutting laser technology less suitable for BAR mass-transfer applications. A particularly suitable laser is a passive mode-locked laser system such as the PicoBlade 2 Picosecond Micromachining Laser from Lumentum Operations LLC, Milpitas, Calif. USA. The laser can be triggered and synchronized at a repetition rate from 50 Khz to 8 Mhz with fine frequency resolution. For each time period, an ultra-short laser pulse is emitted that serves as a release process by ablating the release layer to release an individual LED device for each laser pulse. Of course, multiple LED devices could be designed to be released for each laser pulse in other embodiments.

Figure 14:
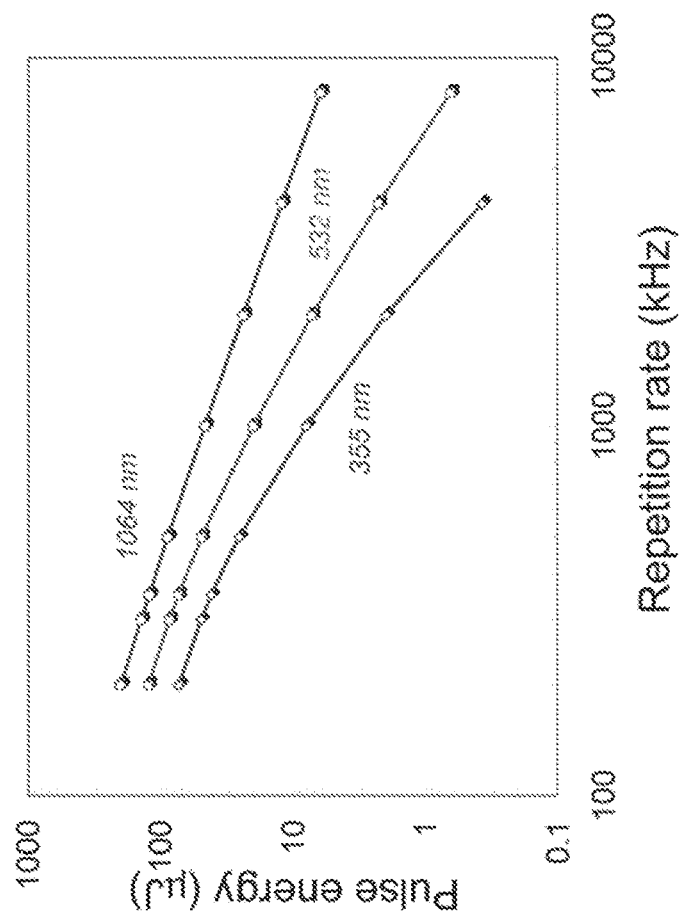
FIG. 14 shows the pulse energy as a function of pulse repetition rate for a specific laser system useful as a beam release laser source according to a specific embodiment of this invention.

A digital signal can select individual pulses to exit the laser on demand. This "Pulse-on-Demand" (PoD) allows operational regimes that can be used by the computer to select only the desired KGD LED devices for release onto the target substrate. The PicoBlade 2 laser pulse width is about 10 ps, assuring an ablation process with minimum Heat-Affected Zone (HAZ) effects on the target release layer and surrounding materials. For typical materials with a characteristic heat diffusion constant of about 1 cm$^2$/sec, the HAZ would be less than 0.05 µm. FIG. 14 shows the pulse energy to pulse repetition frequency relationship of the PicoBlade 2 high-power version. Assuming a 532 nm process and 10 µJ minimum pulse energy, this laser system can allow a pulse repetition rate exceeding 1 MHz. Of course, there can be other variations, modifications, and alternatives.

Figure 15:
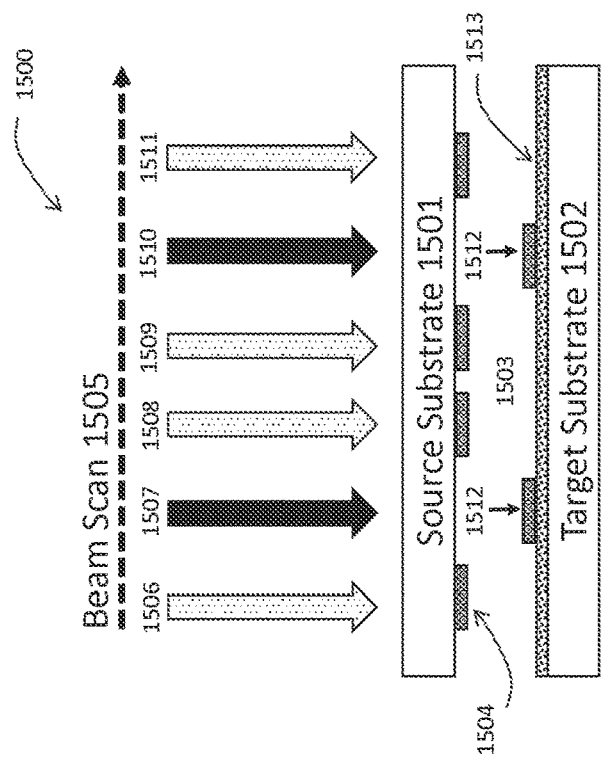
FIG. 15 describes the basic scan process for LED device release according to a specific embodiment of this invention.

The basic LED device release scan process 1500 is shown in FIG. 15 as a cross-section of a source substrate and target substrate undergoing a release laser scan. The source substrate 1501 is positioned over the target substrate 1502 with a gap medium 1503. The gap medium can be air or another interface medium with a gap separating the source to target substrate. Of course, actual contact between the two substrates (no gap) is another possible embodiment.

The goal of having a single laser pulse reliably and uniquely release an addressed LED device places minimum requirements on the beam spot size, energy level and stability, and positioning accuracy and repeatability. A gaussian spot size of about 20 um should be sufficient to selectively release an LED device pitch of about 15 µm or greater. A mask within the source substrate or apodizer/beam shaper may also be effective to keep any stray energies from potentially causing unwanted partial or full release of adjacent LED device. Of course, there can be other variations, modifications, and alternatives.

The laser beam is scanned across a plurality of LED devices such as LED device 1504. In this example, scan system to laser synchronization is made to cause a laser pulse to be emitted by the laser system as the beam position is scanned over each source substrate LED device position through a scan process 1505. A digital signal from the computer will gate the laser pulse from exiting the laser system (utilizing the pulse-on-demand or PoD feature of the PicoBlade 2 system). In this example, the KGD data and matching algorithm determined that LED devices under beam position 1507 and 1510 will be released while the LED devices under beam position 1506, 1508, 1509 and 1511 will not be released. As the beam is scanned from left to right using scan process 1505, the PoD gate signal will be generated to control the laser pulse emission as follows: 1506/OFF, 1507/ON, 1508/OFF, 1509/OFF, 1510/ON, 1511/OFF. For the two instances 1507 and 1510 where the beam is emitted and causes the LED device release process, LED devices 1512 where transferred from the source substrate 1501 to the target substrate 1502. A material 1513 may be added to the target substrate to facilitate capture or retention of the transferred LED devices 1512.

Figure 16B:
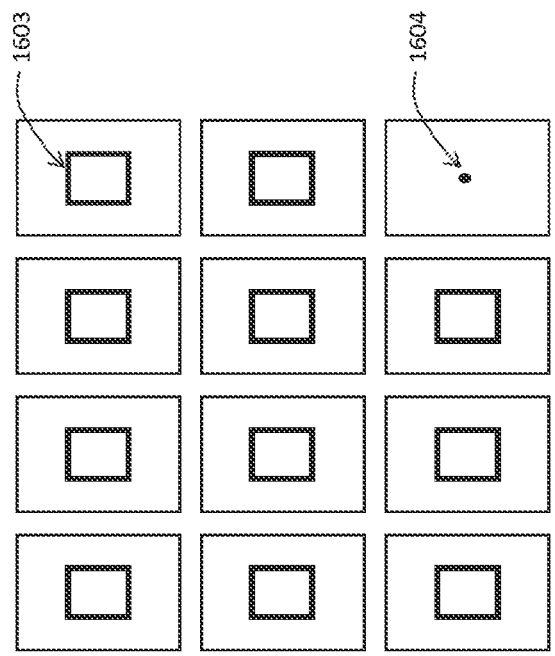
FIG. 16B shows a target substrate pixel array with 2 footprint patterns undergoing a scan process for LED device release according to a specific embodiment of this invention.
Figure 16A:
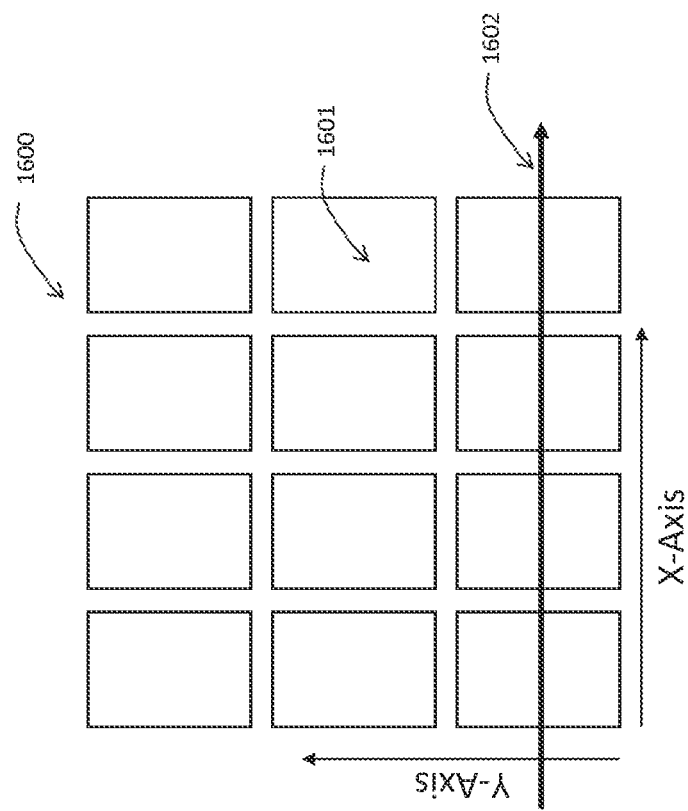
FIG. 16A shows a target substrate pixel array undergoing a scan process for LED device release according to a specific embodiment of this invention.

A scan speed is assumed to be synchronized with the pulse repetition rate according to the following conditions:
$P_{LED}$=LED pitch along the scan direction (m)
$P_{pixel}$=Pixel pitch along the scan direction (m)
$F_1$=Laser pulse repetition rate (Hz)
Scan speed=$P_{LED} \times F_1$ As merely an example, a target pixel array 1100 for the target substrate is shown in FIG. 16A. Each pixel 1601 in this example has a pixel pitch of 75 µm in X and 120 µm in Y. The release laser is scanned in the X-axis such as scan path 1602. For the source substrate assembly previously described with a square 15 µm pitch and a laser pulse frequency of 500 KHz, the required scan speed to have each laser pulse coincide with each possible source substrate LED device location along one axis is 7,500 mm/sec. In this example, one out of every 5 laser pulses may be selected to release a particular LED device onto a target LED pixel area in the X-axis (75 µm pixel pitch/15 µm LED device pitch). The matching criterion for enabling this PoD trigger signal to the laser operating at 500 KHz is a set of conditions as follows:

For each LED location that the laser scans across:
 a. The source LED location is KGD
 b. The target pixel location is within a footprint area
The footprint area is an area within the pixel area where the LED device center locations are allowably transferred. The footprint area center location is $X_{FP}$, $Y_{FP}$ within the pixel area with a range $\Delta X_{FP}$, $\Delta Y_{FP}$. For the example of FIG. 16A and assuming $X_{FP}$, $Y_{FP}$ is the physical center of the target substrate pixel, FIG. 16B shows an example where the footprint 1603 has a range $\Delta X_{FP}$ of 30 µm and a $\Delta Y_{FP}$ of 42.5 µm (2 & 2.5 LED device pixel pitch respectively). Of course, the range $\Delta X_{FP}$, $\Delta Y_{FP}$ can be zero such as pixel location 1604, necessitating the target substrate pixel pitch to be an integer multiple of the LED device pitch in each direction to minimize X-Y motions between the scan head/source substrate and the target substrate. This may be required if accurate LED device placement is required. A lateral LED device architecture may be one such case where a footprint process with $\Delta X_{FP}=0$, $\Delta Y_{FP}=0$ may be required.

A KGD LED device population process with a minimum pixel footprint area allows a substantial increase in flexibility and throughput of the BAR mass-transfer method. To be maximally effective, the minimum footprint range should accommodate at least 2 possible LED devices. If this occurs in X and Y, there will be 4 possible LED devices that can be selected for release to each target pixel area. The relaxation of the specific position of the LED device onto each pixel area affords substantial benefits. One is that X-Y location accuracies can be relaxed, simplifying system hardware and increasing yield. Another is that multiple possible LED devices within each footprint can allow the scan head to populate a site more completely without requiring physically repositioning the scan head. For example, a 100 ppm non-KGD rate (percentage of bad or unavailable LED devices) for a source substrate used within the 4 k-UHD example described below will have an average of 24 LED devices in each site that cannot be matched/released. Micro-jogging will have to occur to line up KGD LED devices over each of these residual pixels, thus lowering throughput. A 2×2 LED device array within a footprint can lower this error rate greatly. Assuming a random location of each non-KGD LED device within the source substrate, this effective error rate number falls to 100 ppm$^4$ or $1\times10^{-16}$. Over ten billion sites could be printed without a need to micro-jog, thus increasing throughput. The method described wherein using a footprint of one or more possible matched LED devices are to reduce or eliminate post mass-transfer processing is defined as Directed Assembly or Smart-Assembly.

Once the source substrate is utilized for site LED device population, the KGD file is updated with the released LED device locations and the effective non-KGD rate will grow and start containing release patterns. Throughput optimization would include maximizing KGD to footprint matching to drive site to site positioning. Once the non-KGD rate is high enough that site micro-jogging grows too numerous according to a predetermined criterion, the source substrate is exchanged for a new source substrate and KGD file.

A process with a sizable footprint area can help speed the BAR mass-transfer process and accommodate unavailable LED devices as described in the source substrate's KGD database file. For the next example, the example of FIG. 16A with a footprint 1603 of FIG. 16B is assumed.

Figure 17B:
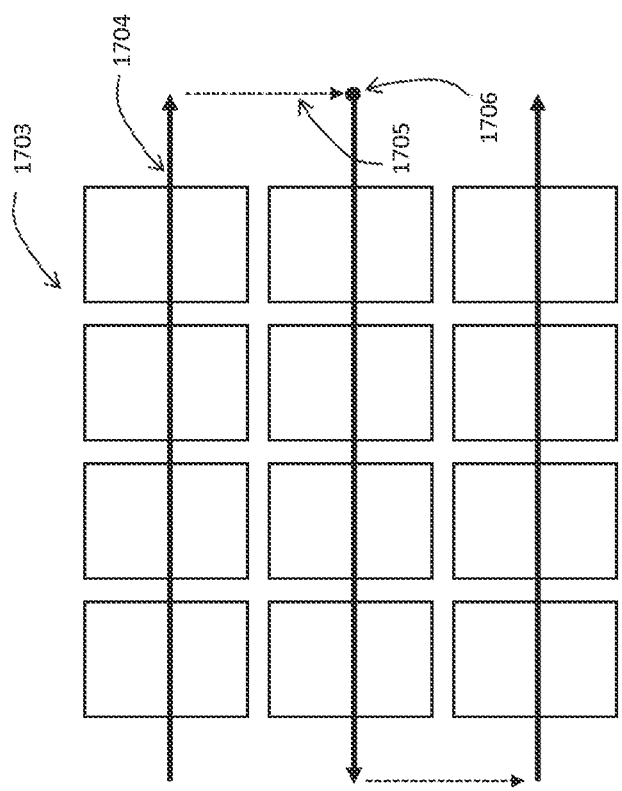
FIG. 17B shows a target substrate pixel array with 2 footprint patterns undergoing a scan process for LED device release according to a specific embodiment of this invention.
Figure 17A:
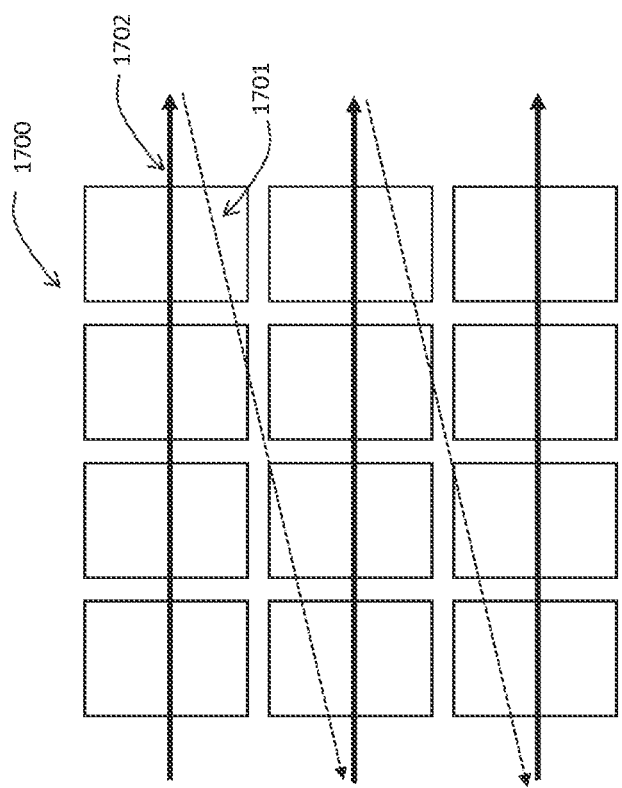
FIG. 17A shows a target substrate pixel array undergoing a scan process for LED device release according to a specific embodiment of this invention.

FIG. 17 shows two possible scan patterns to locate the beam over the target substrate pixel locations. FIG. 17A shows a unidirectional scan of a target pixel array 1200 where a retrace path 1701 is made after each pixel line scan 1702 to reposition the scan system for another unidirectional scan (in this case from left to right). Although the retrace is longer than a bidirectional scan, there may be practical advantages in improving motion dynamics such as reducing scan hysteresis. A potentially faster scan pattern is a bidirectional scan pattern such as shown in FIG. 17B for the X-Y scan of a target pixel array 1703 on a target substrate. At the end of each scan path 1704, a short jog 1705 to a new scan start point 1706 is made and the next scan is in the opposite direction from the previous scan path. The timing of each new scan path is synchronized with the laser system to align each possible laser pulse to the LED devices along the scan path. Of course, there can be other variations, modifications, and alternatives.

Figure 18:
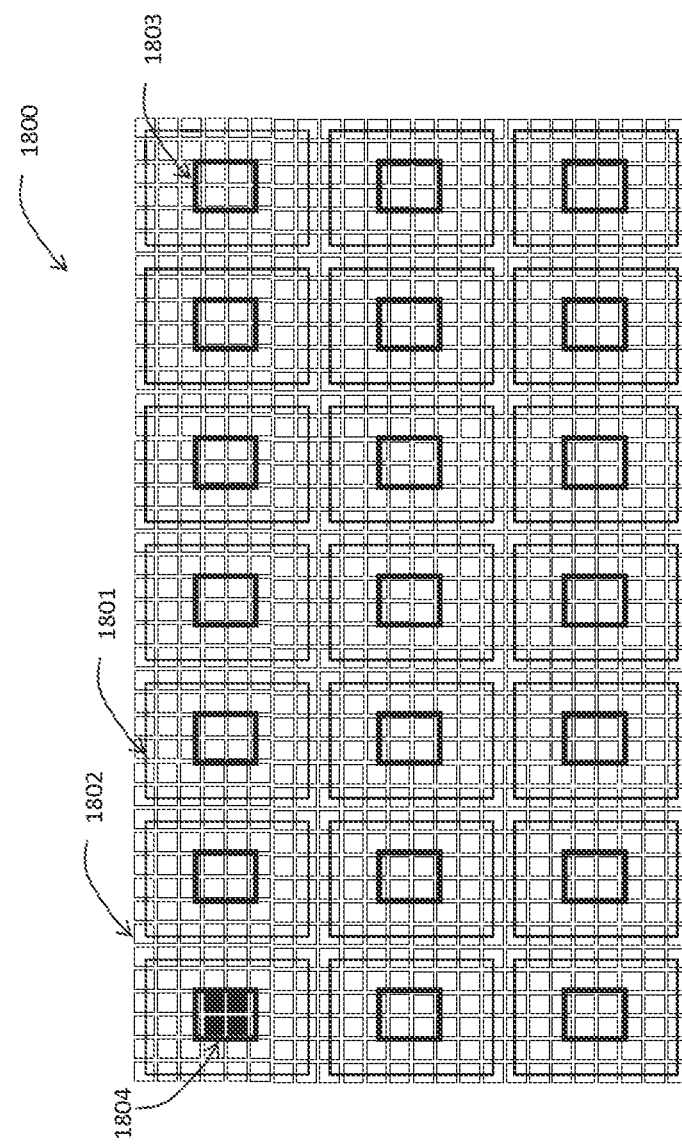
FIG. 18 shows a source and target substrate overlay and the footprint pattern according to a specific embodiment of this invention.

FIG. 18 shows a top view of the source substrate to target substrate transfer process 1800 according to a preferred embodiment of this invention. The target substrate requires each of its pixels 1801 to be populated by an LED device from the source substrate array 1802 of LED devices within the allowable footprint 1803 within each pixel. The footprint in this example allows 4 possible LED devices to be selected for release as shown in 1804. The black LED devices satisfy the footprint area release conditions. The particular LED device location selected for release would also have be available (KDG and not previously released) and optimized for throughput as further explained below.

Figure 19:
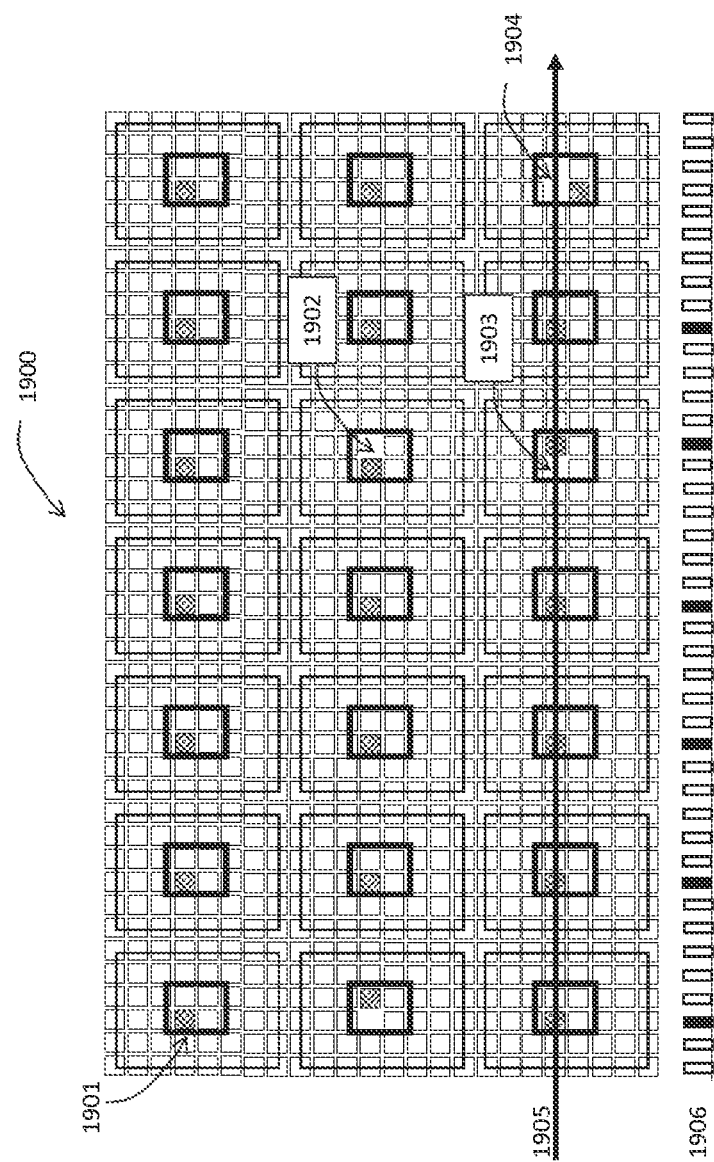
FIG. 19 shows a source and target substrate overlay undergoing a scan process for LED device release according to a specific embodiment of this invention.

FIG. 19 shows a top view of the source substrate to target substrate transfer process 1900 according to a preferred embodiment of this invention. The scan paths and beam release criterion were calculated based on the X-Y position and KGD database file. The hashed LED device location such as 1901 show a LED device position that has been released. If there are some unavailable LED device locations within the footprint such as locations 1902, 1903 and 1904 (both locations), the algorithm may change the beam release to coincide with alternative LED device positions to populate the pixel positions. Beam scan 1905 and pulse pattern 1906 shows how the bottom pixel row would be populated. In this example, the beam is scanned at 7500 mm/sec and crosses each LED device center location every 2 µsec. The laser is set for 500 KHz passive mode-locking and sends a 10 psec laser pulse every 2 µsec coincident with each LED device center location depending if the PoD is enabled. The black rectangles in pulse pattern 1406 are emitted pulses that cause the corresponding LED devices to be released while the white boxes are pulses that were commanded not to be emitted from the laser using the PoD control signal. Pixel 1904 has no release during scan path 1405 and would require a separate scan path (not shown) to release an alternative LED device located on a lower LED device row.

Figure 20:
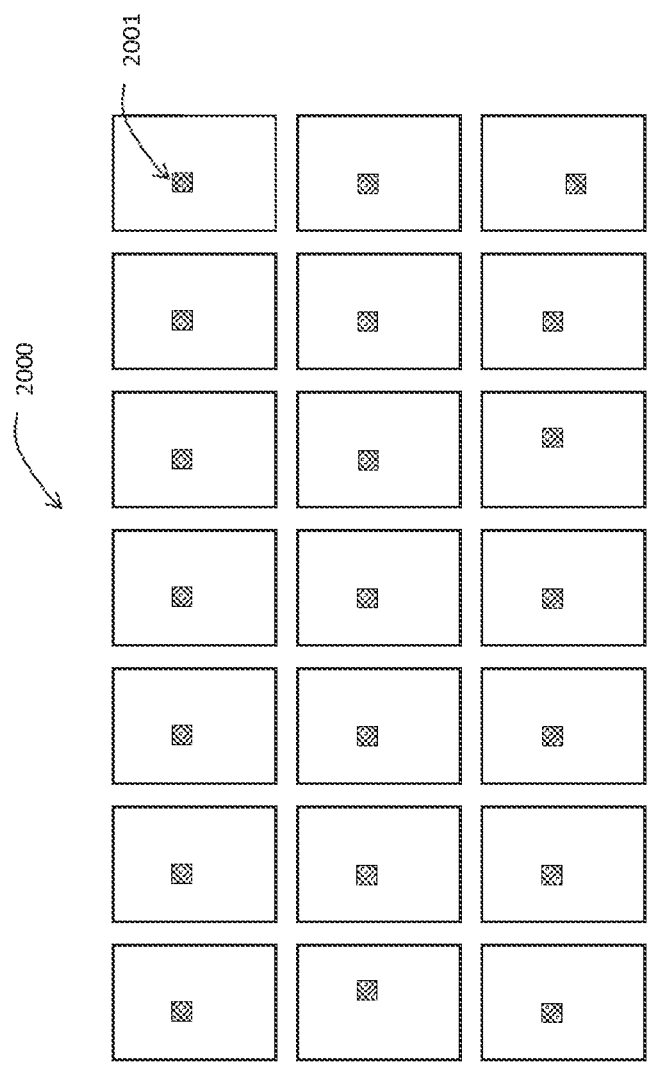
FIG. 20 shows a target substrate after a scan process for LED device release according to a specific embodiment of this invention.

FIG. 20 shows the resulting target substrate pixel array 2000 populated with LED devices such as LED device 2001.

The optimum BAR mass-transfer throughput can be estimated in this example as follows:
 a. LED release rate=500 KHz×(15 µm LED device pitch/75 µm pixel pitch)=100 k LEDs/second
 b. Scan time=105 mm/7,500 mm/sec=14 msec
 c. Retrace time (assume bidirectional scanning)=5 msec
 d. Pixels/scan=105 mm/75 µm pixel pitch=14,000 pixels
 e. Throughput=14,000 pixels/19 msec=74 k pixels/second or 265 Mpixels per hour A 70M LED device source substrate will therefore need to be changed once its LED devices have been largely released. At the above release rate of 265M LED devices per hour, a new source substrate will need to be loaded every 15-16 minutes. Because the release rate will start dropping before the LED devices have all been released due to the increasing number of unavailable LED devices, optimum throughput will require an early exchange of the source substrate according to an optimization algorithm that weighs the additional time and cost for an early exchange to the increasing reposition frequency of the source substrate with a decreasing availability of LED devices. To populate a complete display, other parameters such as source substrate exchange time and site to site move time will become factors in the throughput calculation.

The algorithm to predetermine the scan head position and release sequence within each site scan to efficiently release the most KGD LED devices available from a source substrate is an optimization problem that may benefit from artificial intelligence (AI) and deep learning concepts. As the source substrate is used, prior releases will generate unavailable source LED device patterns that can cause an increasing frequency of micro-jogs to reposition the scan head to match previously unavailable KGD devices on pixels within a site. Optimization algorithms using AI/deep learning may help maximize source substrate device utilization and throughput while lowering the total number of site micro-jogging.

Figure 21:
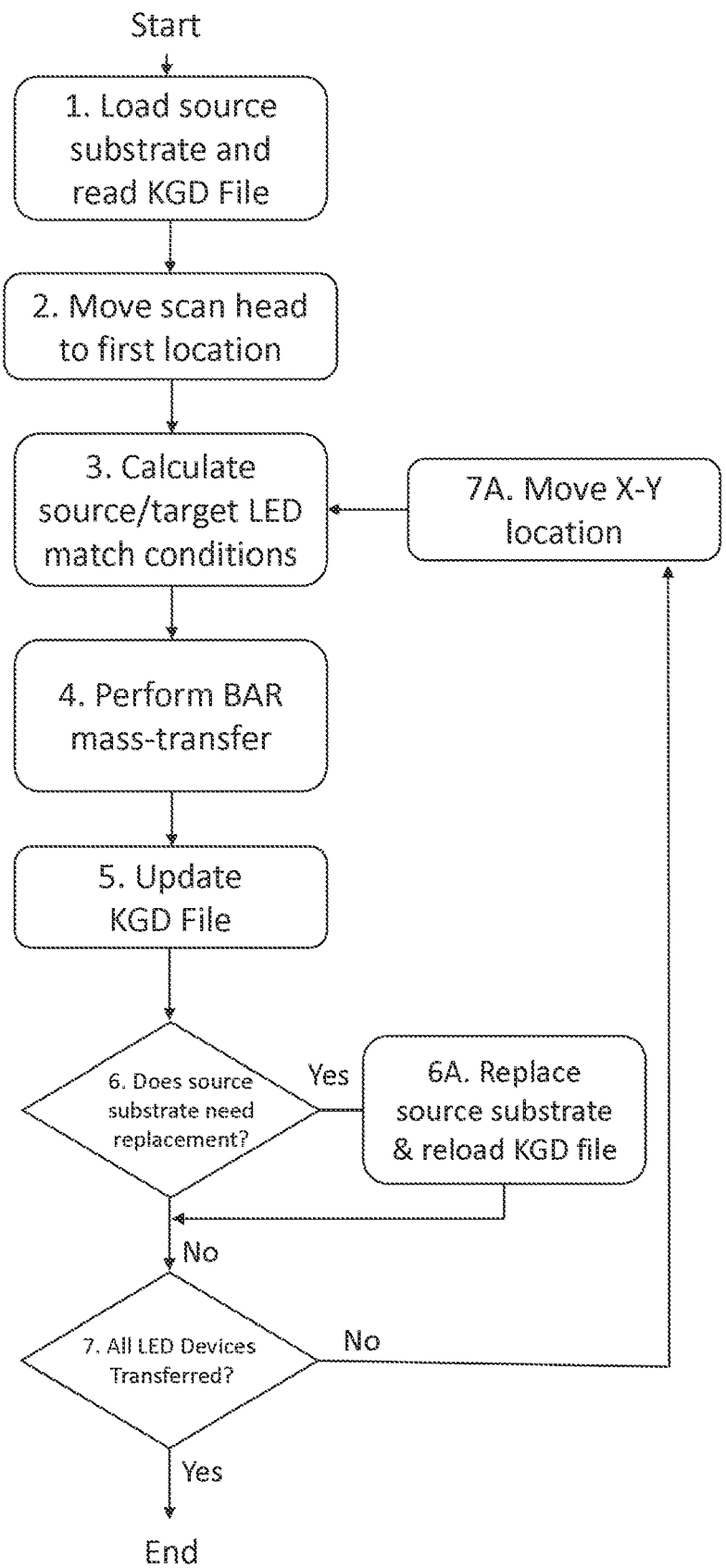
FIG. 21 shows a process flowchart for use of a Beam Addressed Release (BAR) mass-transfer system to populate a target substrate according to a specific embodiment of this invention.
Figure 22:
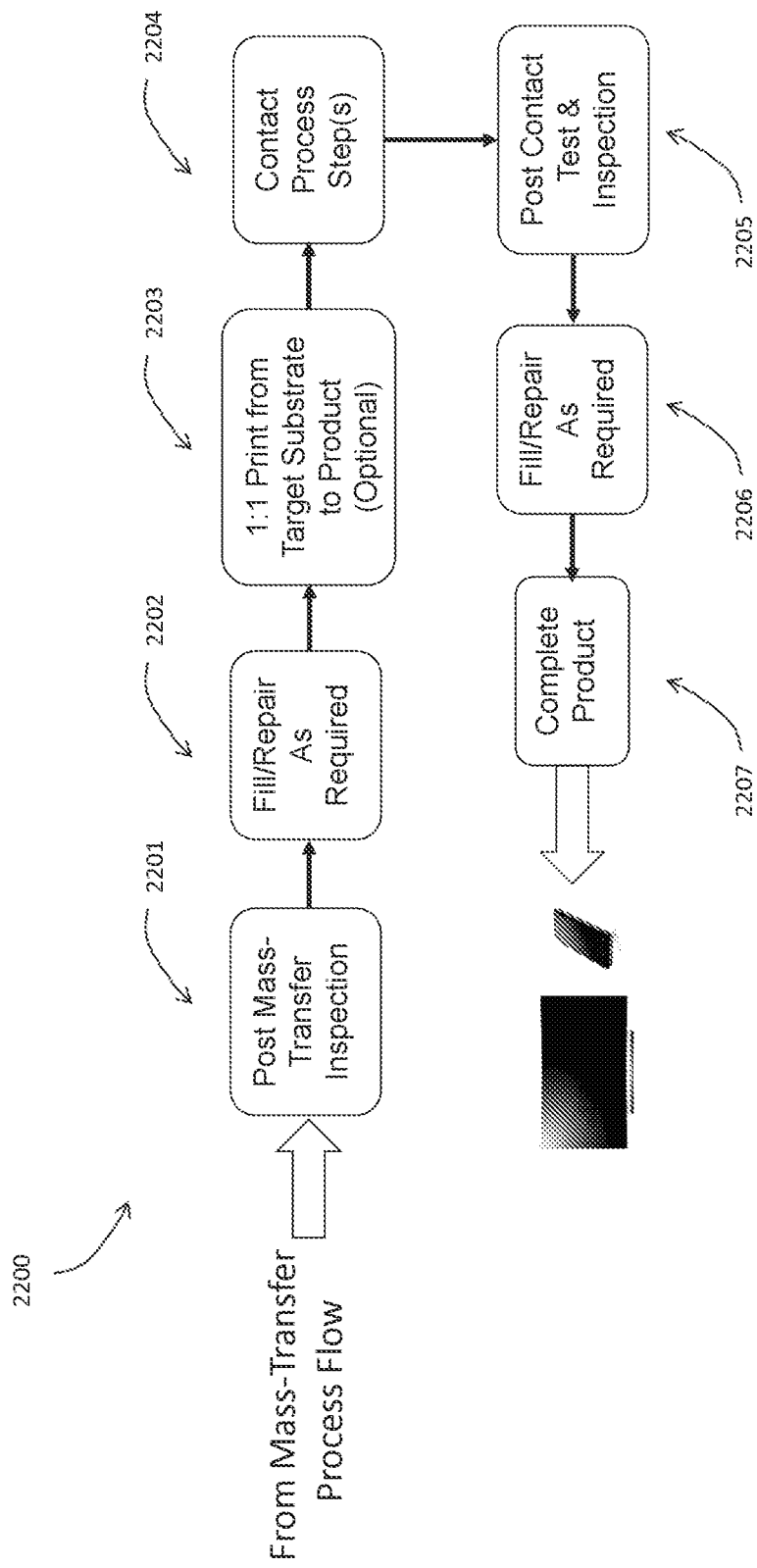
FIG. 22 is the contact process flow following the mass-transfer process flow to complete a display product.

The basic BAR mass-transfer process flowchart is shown in FIG. 21. Once the source substrate and corresponding KGD file is loaded on the scan head and computer (step 1), the computer positions the scan head at the first print location of the target substrate (step 2). A determination of the LED devices matching the release criteria is then calculated (step 3) and the scan head and laser system is then made to address the laser beam pulses to release the desired LED devices onto the target substrate (step 4). Once the list is exhausted, an update of the KGD file is made to add the released LED devices to the list of bad or unavailable LED device locations on the source substrate (step 5). If the number and locations of the residual LED devices on the source substrate fails to meet a predetermined criterion (step 6), the source substrate is replaced and its corresponding KGD file is loaded (step 6A). If there are more locations to populate, the X-Y location is changed (step 7A) and the BAR mass-transfer cycle repeats from step 3.

EXAMPLE 1: 4 k-UHD Resolution (3840H×2160V 16:9) BAR Mass-Transfer Performance Estimate The following is the expected optimum throughput expected for the above laser conditions using a source substrate with 105 mm×105 mm LED device array of 15 µm pitch. The throughput will be somewhat less since it will not account for source substrate exchange time and site to site move time:
   a. Sub-pixel pitch: 125 µm (H)×375 µm (V)
   b. Number of sites: 11,650 cm² display/110.25 cm²=106 sites/display
   c. Pixels per scan line (H): 105 mm/125 µm=840 pixels per scan
   d. Number of scan lines per site: 105 mm/375 µm=280 lines
   e. Site throughput: 280 scan lines×19 msec=5.32 seconds/site
   f. Total pixels per site: 280 scans/site×840 pixels per scan=235,200 pixels/site
   g. Total time per display: 5.32 seconds/site×106 sites/display=564 seconds/display
   h. Pixel throughput=160M pixels/hour The tremendous throughput improvement potential of this method can be appreciated by comparing the roughly 10' per display throughput of the BAR mass-transfer approach in the above example compared to about 25 hours for a pick and place approach for a similar display, about 125 times faster.

EXAMPLE 2: 5.5" HDTV Cellphone Display (1920H×1080V 16:9) BAR Mass-Transfer Performance Estimate The following is the expected optimum throughput expected for the above laser conditions using a source substrate with 105 mm×105 mm LED device array of 15 µm pitch. The throughput will be somewhat less since it will not account for source substrate exchange time and site to site move time:
   a. Scan time: 68.5 mm/7500 mm/sec=9.13 msec (scan in display vertical direction)
   b. Sub-pixel pitch: 21.1 µm (H)×63.4 µm (V)
   c. Number of sites: 1.16 sites/display
   d. Pixels per scan line (V): 68.5 mm/63.4 µm=1080 pixels per scan
   e. Number of scan lines per site: 105 mm/21.1 µm=4975 lines
   f. Site throughput: 4975 scan lines×13.13 msec=65.3 seconds/site
   g. Total pixels per site: 4975 scans/site×1080 pixels per scan=5.37M pixels/site
   h. Total time per display: 65.3 seconds/site×1.16 sites/display=75.7 seconds/display
   i. Pixel throughput=296M pixels/hour Mass-Transfer Methods 10: Array (Multi-Beam) LIFT with Directed Assembly Method (Active)

For the method 10 description, the following source ORC assembly will be assumed:
   a. Source substrate is a DSP sapphire substrate of 150 mm in diameter and 1 mm in thickness having a release layer (RL) releasable with a 0.2 J/cm² pulse process with a 532 nm laser source capable of individual LED device addressing. Pulse duration can be up to 50 nsec.
   b. LED device array of 15 µm×15 µm (10 µm device width with a vertical device architecture and a 5 µm gap or street between devices). Top is anode and bottom is cathode.
   c. LED device array is a square array of 105 mm×105 mm in size containing 70,000×70,000 LED devices or 49 million individual LEDs.

The array multi-beam approach according to this invention features individually selectable LED device addressing and includes the Directed Assembly method to reduce or eliminate the post-process device fill step.

Assuming a good/bad KGD file is produced from the test of the source substrate, the substrate can now be mounted onto a multi-beam scan head made part of a Beam-Addressed Release (BAR) mass-transfer tool to populate a target array with a plurality of LED devices. The BAR mass-transfer system block diagram is similar to the single-beam system described in FIG. 12 except for the integration of the multi-beam scan head 2300 in FIG. 23A substituting for the single-beam scan head 1204. Instead of a scanned single-beam, the multi-beam scan head 2300 scans a programmable area pattern across the donor substrate 2301 to release individual LED devices according to the same algorithms and rules described in method 9.

Figure 23B:
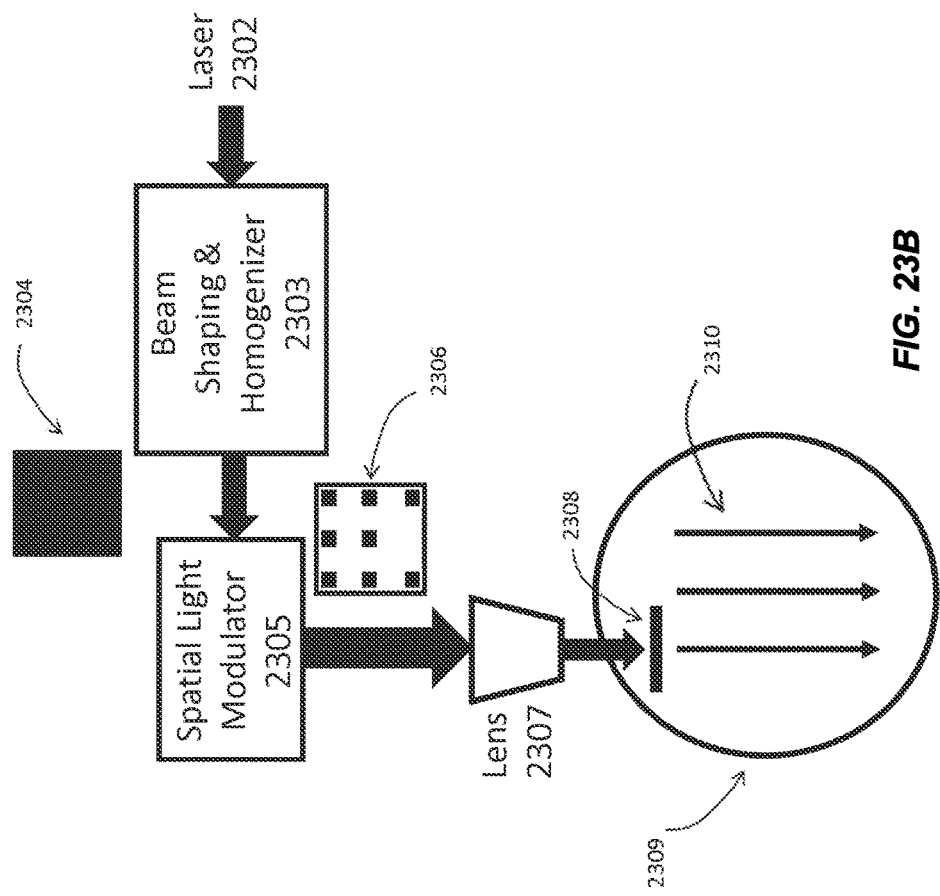
FIG. 23B shows a block diagram of the multi-beam scan method with spatial light modulation patterning according to a specific embodiment of this invention.
Figure 23A:
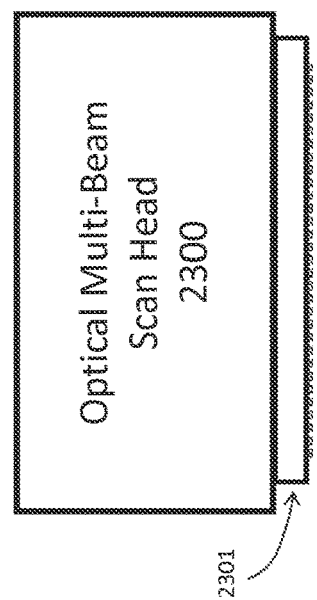
FIG. 23A shows the optical multi-beam scan head sub-system according to a specific embodiment of this invention.

The multi-beam scan head is further described in FIG. 23B. The pulsed laser beam 2302 is first shaped and homogenized to make for an constant "top hat" beam intensity profile within an area 2304. The shaped beam then fills an entrance aperture of a spatial light modulator 2305 that can spatially modulate the shaped beam to form a desired pattern 2306. Spatial modulators are well known for their use in projection displays. As an example, a spatial light modulator model DLP7000 from Texas instruments (Dallas, Tex., USA) can modulate a 14 mm×10.5 mm area with a spatial pattern resolution of 1024×768. With an on/off binary mode, patterns can be refreshed at up to 32 kHz rate. In this application, the pattern would modulate the laser pulse intensity spatially to select different areas to process the release layer. For example, the beam area 2306 shows a 3×3 beam intensity pattern except for the bottom middle area that was selected off.

The modulated beam pattern is then projected and imaged onto the source substrate 2301. In this example, a cylindrical lens asymmetrically demagnifies pattern 2306 to form line source 2308. An internal scanner moves this imaged pattern across the source substrate 2301 using, in this example, a unidirectional scan pattern path 2310.

Most spatial light modulator (SLM) devices are constructed with elements and materials that can operate at higher optical power in the visible spectrum. The DLP7000 is designed to operate at 400-700 nm. A UV-enhanced DLP model (DLP9500UV) only extends this range downwards to 363 nm with substantially derated optical power specification. This points to a strong advantage of using a release layer that can operate in the visible spectrum. Selecting the 532 nm double-YAG line makes numerous high-power and flexible industrial laser solutions available while assuring the compatibility with most SLMs.

532 nm Multi-Beam BAR Mass-Transfer Design Example

An example design of a BAR system exceeding 500M LED devices/hour using the DLP7000 SLM device uses the following sub-components and parameters:

a. Coherent Model AVIA NX-532-65 HPE (813 uJ/pulse, single-shot to 300 kHz, <30 nsec pulse width)
b. Texas Instruments DLP7000 Spatial Light Modulator
c. SLM projection to 2 cm×20 um line at the source substrate plane (0.004 cm² beam area)
d. Scan velocity 50 mm/sec, pulse rep rate 25 kHz The area scanned at the target is 25 kHz×0.004 cm²=100 cm²/sec & pulse energy density 813 uJ/0.004 cm²=200 mJ/cm². This meets the expected single-shot energy density for release.

The assembly rate for a 75" UHD 4 k display at about 1600 microLED/cm² density can readily be calculated as:

Assembly Rate=100 cm²/sec×1600 LEDs/cm²×3600 sec/hr=576M LED/hr

This throughput will be somewhat derated due to site to site motion and to the site to site motion. A rotating polygon can help lower the interscan time delay. The SLM pattern, scanning and stage movements are synchronized much like the single-beam method 9 to perform Directed Assembly.

After the mass-transfer process flow, a complete array of KGD LED devices are now in the correct locations on the target substrate. A proposed back-end process flow 1100 is shown in FIG. 11. The first step is to confirm that all LED devices are positioned and free from visible damage using a post-transfer inspection step 1101 and fill/repair 1102 as needed. If the mass-transfer process flow assembled the LED devices on the final product surface, 1:1 print step 1103 will not be necessary. If the target substrate is not the final product surface, 1:1 print step 1103 will transfer the LED devices to the final product surface. One possible print/transfer system is a roll-roll system that could achieve high-speed and combine heat and pressure to contact the devices (steps 1103 and 1104 could be the same step). If needed, a contacting step would use deposition and other methods to electrically connect each LED device. After contacting step 1104, post-contact test and inspection 1105 could power the array to confirm electro-optical functionality. If there are failures, a final fill/repair step 1106 would correct these devices. The final assembly steps within 1107 would complete the product.

It is the object of this invention to reduce the mass-transfer assembly process defect rate using KGD test and compatible mass-transfer to drive the post-transfer repair/rework level to low and manageable levels.

Figures 24A, 24B:
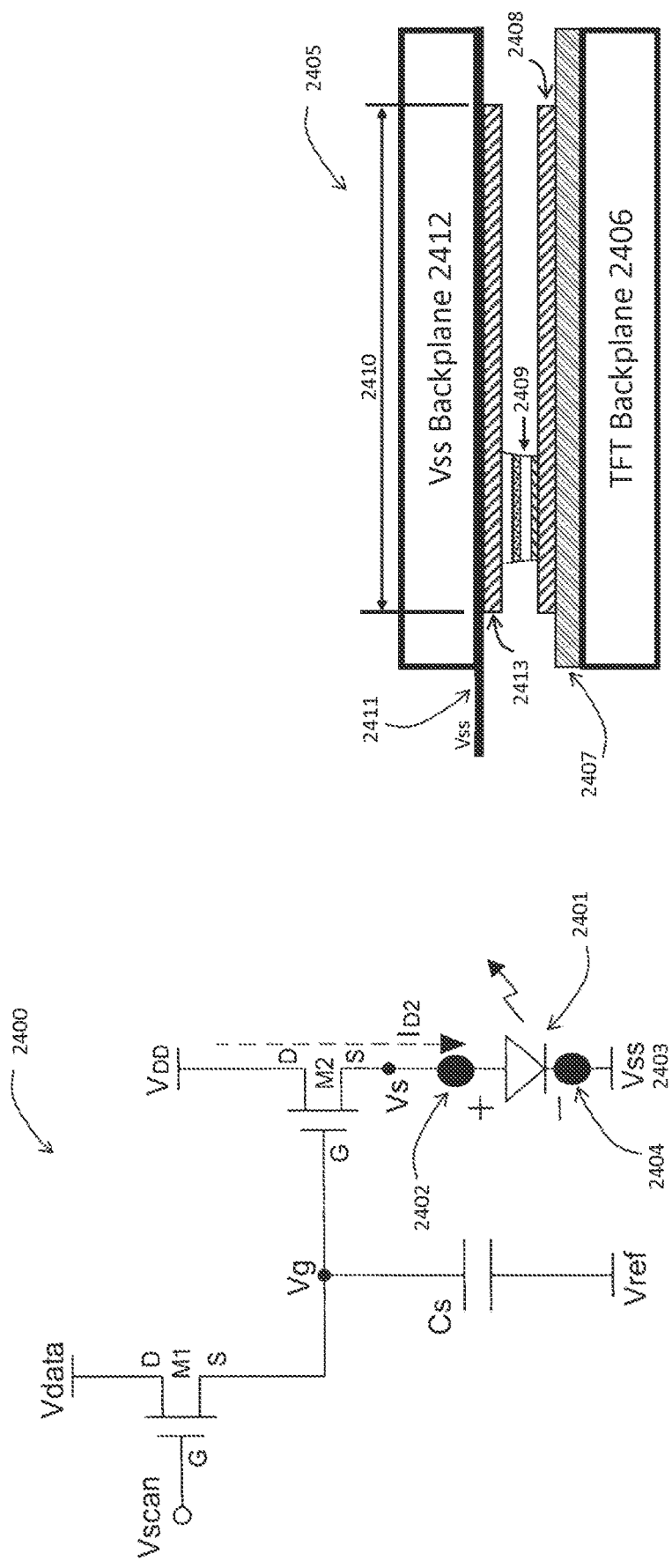
FIG. 24A shows a LED device addressing circuit used in certain embodiments of this invention.
FIG. 24B shows a cross-section of a TFT active-matrix backplane connecting an LED device within a pixel footprint area with a common Vss backplane according to a specific embodiment of this invention.

The method 9 and 10 Directed Assembly methods generally describe a footprint with a finite area that allows multiple possible LED devices to be selected for release. This approach imposes certain restrictions and conditions regarding the LED device and interconnection design. One design that allows flexible LED device location positioning within a pixel is a vertical LED design and a top/bottom area contact method using an anisotropic contact film as described below. FIG. 24A shows an active-matrix Thin-Film Transistor (TFT) pixel backplane circuit 1700 that can be used to bias each individual LED device 2401 within a pixel area. To generate a display pattern on a display, each pixel LED device is controlled by 2 transistors M1 and M2. Transistor M1 is a gate transistor that receives a voltage from the Vdata line when Vscan turns M1 on and transfer a voltage Vg related to Vdata to a storage capacitor Cs. This bias voltage Vg in turn controls a second transistor M2 connected as a source follower to develop a current sourced from voltage Vdd. The level of current through the LED device is therefore addressable by this circuit to allow greyscale brightness levels for the pixel.

The LED device 2401 has an anode (denoted by "+") connected to the active-matrix TFT backplane by contact 2402. It also has a cathode (denoted by "−") connected through a backplane 1703 and a voltage Vss by contact 2404.

One example of a physical realization of the circuit represented by FIG. 17A is shown in FIG. 24B. In this laminated display structure 2405, a TFT backplane 2406 having the TFT circuitry contained in layer(s) 2407. The anode contact 2402 would connect to an area contact layer 2408. This layer would have the ability to contact a released LED device 2409 located within the area denoted by the range 2410. Range 2410 is related but not synonymous to the footprint range $\Delta X_{FP}$, $\Delta Y_{FP}$ since the footprint denotes the allowable locations of the released LED device centers while range 2410 is the total bond area. LED device 2409 is shown located off-center to show how an arbitrary position of the LED device within the footprint can still allow top and bottom contact. The cathode contact 2404 is made using a common contact 2411 on a Vss backplane 2412 and area contact layer 2413.

Figure 25:
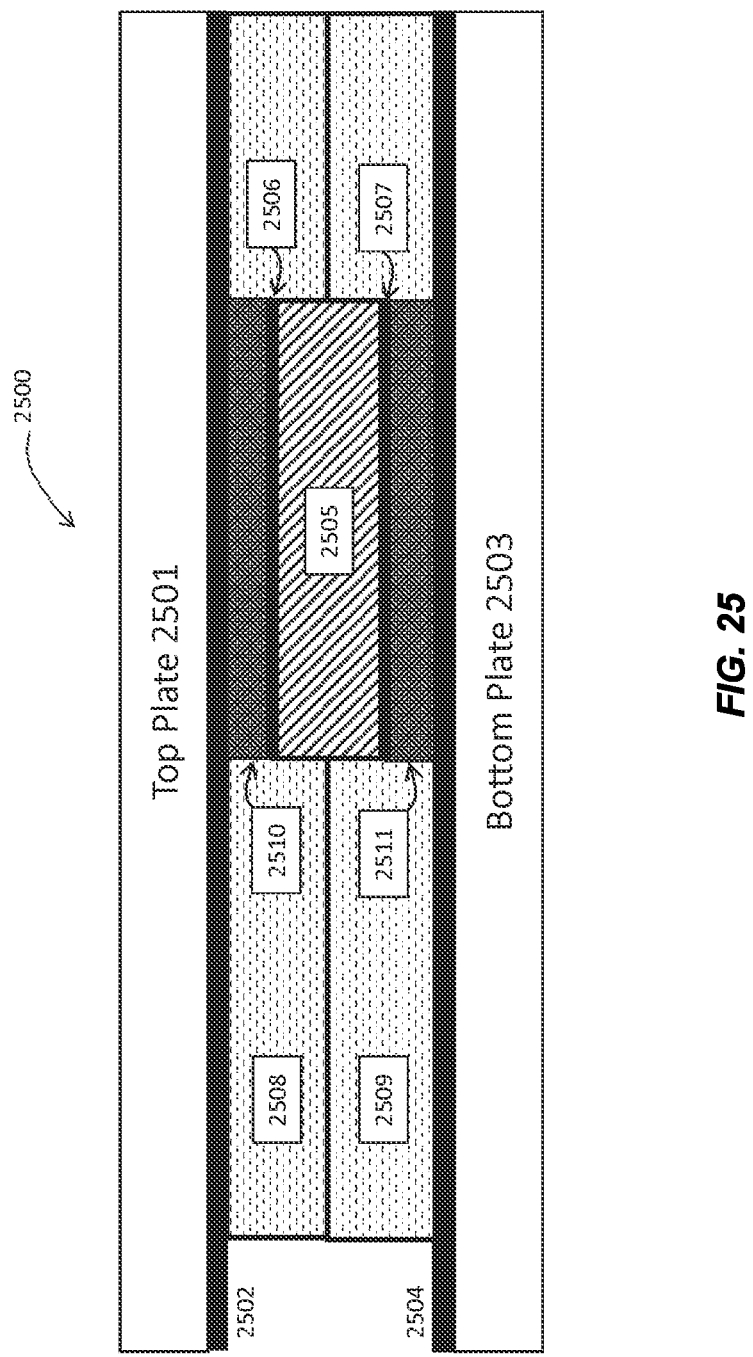
FIG. 25 shows a cross-section of a anisotropic interconnect method for connecting an LED device within a pixel footprint area between two area contacts according to a specific embodiment of this invention.

Area contact layers 2408 and 2413 must have the ability to reliably contact the LED device anode and cathode to the underlying Vss and TFT backplane contacts but resist broadly contacting (shorting) the Vss and TFT backplane contacts. FIG. 25 shows how this can be accomplished by the use of a special material impregnated with conductive particles for area contact layers 2408 and 2413.

FIG. 25 shows an example of how an area contact material such as material 2408 and 2413 depicted in FIG. 24 can be used to selectively contact an LED device. FIG. 25 shows two plates contacting an LED device as assembly 2500. There is a top plate 2501 with a contact surface 2502 and bottom plate 2503 with a contact surface 2504. Each contact surface need to be electrically connected to LED device 2505 having a top contact surface 2506 and a bottom contact surface 2507. The area contact material 2508 and 2509 is a material that can change its electrical conductivity as a function of external characteristics such as temperature, pressure and the like. As merely an example, the LED device 2505 is assumed to have been released onto the bottom area contact material 1809. When the top plate 2501 is fixed onto the bottom plate 2503 using a bond or lamination process, the characteristics of the area contact material is changed from a non-conductive state to a conductive state (regions above 2510 and below 2511 of LED device 2505. This action would complete the circuit for the LED in a general and manufacturable manner while ensuring contacts 2502 and 2503 remain in a high impedance state.

Figure 26:
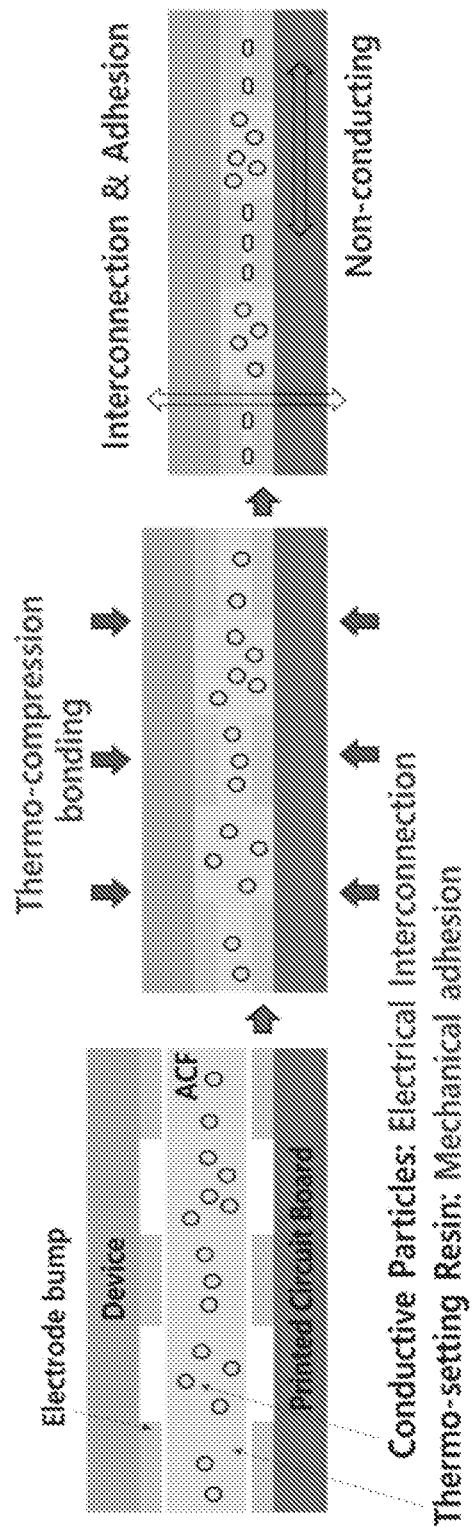
FIG. 26 shows how an anisotropic contact film (ACF) can be used to selectively contact two surfaces with a contact pattern.

One example of a suitable area contact material is an anisotropic conductive film (ACF) that can change from a non-conductive to a conductive state with temperature and pressure. The material is composed of a thermosetting resin impregnated with metallic particles. FIG. 26 shows how a contact pattern can be realized using this material. The example depicts a device to printed circuit board contact application however the material can be adapted to perform in an application described in FIG. 25. Manufacturers of ACF materials include Dexerials Corporation and Hitachi Chemicals Co., Ltd., both from Tokyo, Japan. Special formulations may be required to improve LED device light emission through the ACF material. For example, the conductive particles may comprise of transparent conductive oxide particles such as ITO particles in a clear binder. Of course, there can be other materials, variations, modifications, and alternatives.

The use of a lateral LED device structure instead of a vertical LED device structure in a BAR mass-transfer process with non-zero footprint range is possible. One approach would be to prepare the lateral device to have contact posts in the vertical direction. Separate contacting would occur during the post-transfer lamination/sealing step where the devices are pressed within the multi-level contact area. One terminal would contact a deeper level while the other would separately contact a shallower contact level.

The target substrate can be the display product surface or any suitable surface that can serve as a receiving surface for the released LED devices. The target substrate can in turn become a LED carrier for a roll-to-roll or other printing tool that can capture the LED devices arranged on the target substrate and print them onto a final surface. The purpose of the BAR mass-transfer tool in either case continues to be to rapidly and efficiently perform the areal density conversion between the source substrate to a target substrate.

The light output of the LED devices can be in either or both directions (up or down) using a reflective material or transparent conductive electrode depending on specific embodiments.

The previous examples of the BAR mass-transfer method involve an areal density conversion of the source substrate LED device pitch to a different target substrate pixel pitch but this is not necessary. A 1:1 areal density conversion is also possible for applications such as microdisplays for Augmented Reality (AR), Virtual Reality (VR) and microprojectors. In a 1:1 areal density conversion, every pixel will be released during a scan process. Taking the example of a 15 um LED device pitch and a 500 KHz laser repetition rate, the scan speed is still 7,500 mm/sec however all pulses are selected for the release process. KGD file information is less important during execution but nonetheless can be utilized to avoid separating LED device arrays containing defective LED devices.

Testing for completeness of the release process and functionality of the released LED devices after BAR mass-transfer may be made using optical, electrical and electro-optical inspection and test methods before a lamination or other sealing process. Rework may also be attempted based on the inspection and test results.

While the above is a full description of the specific embodiments, various modifications, alternative constructions and equivalents may be used. Although the above has been described using a selected sequence of steps, any combination of any elements of steps described as well as others may be used. Additionally, certain steps may be combined and/or eliminated depending upon the embodiment. Furthermore, although the description and examples has been directed towards GaN LED devices on a planar surface, any planar or curved surface containing photon emitting devices could be transferred using the BAR mass-transfer method. For example, Vertical-Cavity Surface-Emitting Lasers (VCSELs), Organic LEDs (OLEDs), silicon photonics devices and other surface emitting devices could be mass-transferred using this invention. Additionally, in another example, II-VI semiconductor materials and associated devices can also be used. Although the above has been described for a light-emitting device mass-transfer application, the BAR mass-transfer apparatus and method can also be used to transfer other devices such as sensors, MEMS and other microelectronic or opto-electronic devices. For example, accelerometers, positional sensors, magnetic and capacitive sensors, and optical detectors could be made available on a source substrate for release onto a target substrate according to embodiments of this invention. Of course, there can be other variations, modifications, and alternatives. Therefore, the above description and illustrations should not be taken as limiting the scope of the present invention which is defined by the appended claims.

What is claimed is:

1. An apparatus for transferring a plurality of light-emitting device structures disposed on a source substrate to a target substrate, the apparatus comprising:
    a laser source capable of emitting pulses of light sufficient to disunite a portion of the plurality of light-emitting device structures from the source substrate through a beam addressable release process;
    a multi-beam scan head onto which the source substrate can be releasably mounted, the multi-beam scan head including a spatial light modulator device to receive an incident laser area beam, form a spatially modulated area light beam and direct the spatially modulated area light beam within a scan area located on at least a portion of the source substrate mounted onto the multi-beam scan head;
    a vertical motion and control device to position at least a portion of the source substrate held by the multi-beam scan head, and containing the plurality of light-emitting device structures, in close proximity to at least a portion of the target substrate with an intervening interface region;
    a support and motion system capable of enacting relative movement between the multi-beam scan head holding the source substrate and the target substrate;
    a computer device capable of reading and updating a Known Good Die (KGD) computer file that contains information about the plurality of light-emitting device structures disposed on the source substrate and can control the multi-beam scan head and target substrate relative motion, and control laser source;
    wherein the beam addressable release process causes the portion of the plurality of light-emitting device structures to be released onto predetermined locations on the target substrate.

2. The apparatus of claim 1 wherein the light-emitting device structures are mounted onto the source substrate with an intermediary release layer.

3. The apparatus of claim 1 wherein the laser source is a 355 nm, 532 nm or 1064 nm pulsed laser.

4. The apparatus of claim 3 wherein the pulsed laser is Q-switched or passive mode-locked.

5. The apparatus of claim 2 wherein the release layer is ITO or InN.

6. The apparatus of claim 1 wherein the intervening interface region is a gap medium.

7. The apparatus of claim 6 wherein the gap medium comprises a gas or vacuum.

8. The apparatus of claim 6 wherein the gap medium comprises a liquid.

9. The apparatus according to claim 1 wherein the KGD computer file is updated with locations of released light-emitting device structures.

10. The apparatus according to claim 1 wherein the multi-beam scan head is indexable to a new target area for another beam addressable release process.

11. The apparatus according to claim 1 wherein the close proximity to the at least the portion of the target substrate is actual contact with the source substrate and the target substrate.

12. The apparatus according to claim 1 wherein the spatial light modulator is an area modulator that can modulate the incident laser area beam using an array of individually programmable sub-areas.

* * * * *